(12) United States Patent
Bok et al.

(10) Patent No.: US 12,356,828 B2
(45) Date of Patent: Jul. 8, 2025

(54) DISPLAY DEVICE

(71) Applicant: Samsung Display Co., Ltd., Yongin-Si (KR)

(72) Inventors: Seung-Lyong Bok, Yongin-si (KR); Kicheol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 55 days.

(21) Appl. No.: 18/205,644

(22) Filed: Jun. 5, 2023

(65) Prior Publication Data
US 2024/0074280 A1 Feb. 29, 2024

(30) Foreign Application Priority Data
Aug. 30, 2022 (KR) .................. 10-2022-0109103

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0416* (2013.01); *G06F 3/0446* (2019.05);
(Continued)

(58) Field of Classification Search
CPC .... H10K 59/40; H10K 59/122; H10K 59/131; H10K 59/8792; H10K 59/88; H10K 50/00; H10K 59/00; H10K 59/352; H10K 59/353; H10K 59/80; H10K 50/844; G06F 3/0416; G06F 3/0446; G06F 2203/04106; G06F 2203/04112; G06F 3/0412; G06F 3/046; G09F 9/335
See application file for complete search history.

(56) References Cited

U.S. PATENT DOCUMENTS

| 10,488,992 | B2 | 11/2019 | Shahparnia et al. |
| 10,983,639 | B2 | 4/2021 | Han et al. |

(Continued)

FOREIGN PATENT DOCUMENTS

| CN | 110379356 | 10/2019 |
| CN | 111399684 | 7/2020 |

(Continued)

*Primary Examiner* — Bryan Earles
(74) *Attorney, Agent, or Firm* — F. CHAU & ASSOCIATES, LLC

(57) ABSTRACT

A display device, which includes a display panel including a plurality of first light emitting devices, a plurality of second light emitting devices, a plurality of third light emitting devices, and an input sensing part disposed on the display panel and including sensing parts. A distance between a first light emitting device, of the plurality of first light emitting devices, and an third light emitting device, of the plurality of third light emitting devices, is greater than a distance between the first light emitting device and an adjacent second light emitting device, of the plurality of second light emitting devices, and a width of a sensing part disposed between the first and third light emitting devices adjacent to each other is greater than a width of a sensing part disposed between the first and second light emitting devices adjacent to each other.

21 Claims, 30 Drawing Sheets

(51) Int. Cl.
  *G06F 3/044*    (2006.01)
  *H10K 59/122*   (2023.01)
  *H10K 59/131*   (2023.01)
  *H10K 59/80*    (2023.01)
  *H10K 59/88*    (2023.01)

(52) U.S. Cl.
  CPC ......... *H10K 59/122* (2023.02); *H10K 59/131* (2023.02); *H10K 59/8792* (2023.02); *H10K 59/88* (2023.02); *G06F 2203/04106* (2013.01)

(56) References Cited

U.S. PATENT DOCUMENTS

| | | | |
|---|---|---|---|
| 11,009,985 | B2 | 5/2021 | Park et al. |
| 11,094,772 | B2 | 8/2021 | Ma et al. |
| 11,249,582 | B2 | 2/2022 | Kim et al. |
| 11,422,652 | B2 | 8/2022 | Pak et al. |
| 2018/0039360 | A1* | 2/2018 | Akimoto ................ H10K 59/40 |
| 2019/0369784 | A1* | 12/2019 | Yao ...................... H10K 59/122 |
| 2020/0264731 | A1* | 8/2020 | Naganuma ............ G06F 3/0445 |
| 2021/0026483 | A1* | 1/2021 | Miyamoto ............ G06F 3/0412 |
| 2021/0288126 | A1 | 9/2021 | Hong et al. |
| 2022/0004283 | A1* | 1/2022 | Akiyoshi .............. G06F 3/0412 |
| 2022/0164060 | A1* | 5/2022 | Yamamoto ........... G06F 3/0418 |
| 2023/0117610 | A1* | 4/2023 | Shin .................... G06F 3/04164 |
| | | | 345/173 |
| 2024/0074279 | A1* | 2/2024 | Lu ........................ G06F 3/0412 |

FOREIGN PATENT DOCUMENTS

| | | |
|---|---|---|
| KR | 10-2018-0045944 | 5/2018 |
| KR | 10-2019-0081756 | 7/2019 |
| KR | 10-2020-0141874 | 12/2020 |
| KR | 10-2021-0115084 | 9/2021 |
| KR | 10-2349699 | 1/2022 |

* cited by examiner

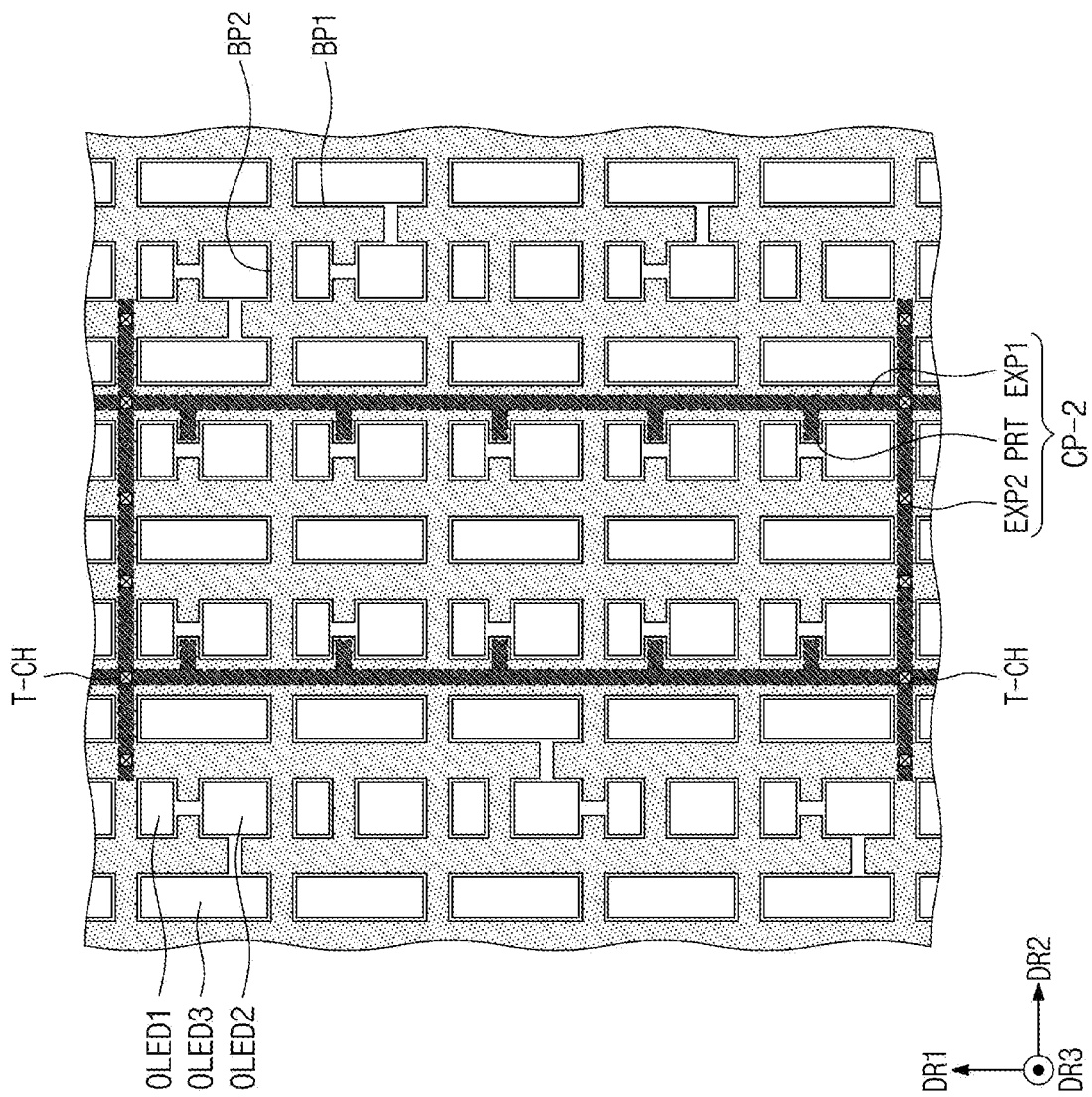

DISPLAY DEVICE

CROSS-REFERENCE TO RELATED APPLICATION

This application claims priority under 35 U.S.C. § 119 to Korean Patent Application No. 10-2022-0109103 filed on Aug. 30, 2022, in the Korean Intellectual Property Office, the disclosure of which is incorporated by reference herein in its entirety.

TECHNICAL FIELD

Embodiments of the present invention relate to a display device.

DISCUSSION OF THE RELATED ART

In general, electronic devices such as smart phones, digital cameras, notebook computers, navigation systems, smart televisions, and the like that provide images to users include display devices for displaying images. Generally, the display device generates an image and then provides the user with the generated image through a display screen.

Typically, the display device includes a display panel that generates an image and an input sensing part that is disposed on the display panel and that is configured to sense an external input. The input sensing part is disposed on the display panel and senses a user's touch as an external input. The input sensing part includes a plurality of sensing parts for sensing an external input and connection patterns for connecting the sensing parts.

Typically, the connection patterns are disposed under the sensing parts to connect the sensing parts to each other. The connection patterns arranged more sporadically than densely arranged sensing electrodes may be perceived from the outside.

When a touch pen is used as an external input, the touch pen transmits a preset signal to the input sensing part, and the input sensing part detects a signal of the touch pen. The touch pen is driven at a predetermined frequency.

The driving frequency of the display panel is different from the driving frequency of the touch pen. When the operation of the display panel and the touch pen are performed together, signal interference may occur between the display panel and the touch pen, and thus a signal delay with respect to the display panel may occur. An image display operation might not be normally performed due to such a signal delay.

SUMMARY

Embodiments of the present invention provide a display device capable of preventing recognition of connection patterns and dummy electrodes disposed under first and second sensing parts, and preventing signal interference between a display panel and a touch pen.

According to an embodiment of the present invention, a display device includes: a display panel including a plurality of first light emitting devices having a first color, a plurality of second light emitting devices having a second color, a plurality of third light emitting devices having a third color, and a pixel defining layer separating the first, second, and third light emitting devices from each other; and an input sensing part disposed on the display panel and overlapping the pixel defining layer, wherein the input sensing part includes at least one sensing part, and wherein a distance between a first light emitting device of the plurality of first light emitting devices and an adjacent third light emitting device of the plurality of third light emitting devices is greater than a distance between the first light emitting device and an adjacent second light emitting device of the plurality of second light emitting devices, and wherein a width of the sensing part disposed between the first light emitting device and the adjacent third light emitting device is greater than a width of the sensing part disposed between the first light emitting device and the adjacent second light emitting device.

In an embodiment of the present invention, the first color is red, the second color is green, and the third color is blue.

In an embodiment of the present invention, the input sensing part further includes a connection pattern disposed under the sensing part, and wherein a width of the connection pattern is less than the width of the sensing part.

In an embodiment of the present invention, the first and second light emitting devices are arranged in odd-numbered columns, wherein the third light emitting devices are arranged in even-numbered columns, wherein the column extends in a first direction, and wherein the third light emitting devices are arranged adjacent to each other in pairs in each of the even-numbered columns and are grouped into pairs to form a plurality of groups each of which includes a pair of third light emitting devices, and wherein the first light emitting devices and the second light emitting devices are alternately arranged in the first direction, wherein a pair of first and second light emitting devices that are adjacent to each other among the first and second light emitting devices are adjacent to a corresponding third light emitting device among the third light emitting devices in a second direction crossing the first direction, and wherein the plurality of groups are staggered, with respect to each other, in two adjacent even-numbered columns.

In an embodiment of the present invention, the connection pattern is connected to first sensing parts between a k-th group and a (k+1)-th group among the plurality of groups disposed under the first sensing parts, and where 'k' is a natural number.

In an embodiment of the present invention, a first distance in the second direction between the pair of the first and second light emitting devices and the corresponding third light emitting devices is greater than a second distance in the first direction between the pair of the first and second light emitting devices, and wherein a third distance in the first direction between a third light emitting device of the k-th group and a third light emitting device of the (k+1)-th group facing each other in the first direction is greater than each of the first distance and the second distance.

In an embodiment of the present invention, the sensing part includes: first sensing parts arranged in the first direction and connected to each other through the connection pattern; second sensing parts arranged in the second direction crossing the first direction; and an extension pattern extending from the second sensing parts.

In an embodiment of the present invention, the connection pattern is connected to first sensing parts between a k-th group and a (k+1)-th group among the groups disposed under the first sensing parts, and where 'k' is a natural number.

In an embodiment of the present invention, a first distance in the second direction between the pair of the first and second light emitting devices and the corresponding third light emitting devices is greater than a second distance in the first direction between the pair of the first and second light emitting devices, and wherein a third distance in the first direction between a third light emitting device of the k-th group and a third light emitting device of the (k+1)-th group facing each other in the first direction is greater than each of the first distance and the second distance.

In an embodiment of the present invention, each of the first sensing parts includes a plurality of branch portions disposed between the first, second, and third light emitting devices and extending in the first direction and the second direction, without overlapping the first, second, and third light emitting devices, wherein each of the first sensing parts has a mesh shape, and wherein among the plurality of branch portions, the branch portions extending in the second direction do not extend between the third light emitting devices of each of the plurality of groups.

In an embodiment of the present invention, a first width in the second direction of a branch portion, of the plurality of branch portions, disposed between the pair of first and second light emitting devices and the corresponding third light emitting device is greater than a second width in the first direction of a branch portion, of the plurality of branch portions, disposed between the pair of first and second light emitting devices, and wherein a third width in the first direction of a branch portion, of the plurality of branch portions, disposed between a third light emitting device of a k-th group and a third light emitting device of a (k+1)-th group facing each other in the first direction is greater than the first width, and where 'k' is a natural number.

In an embodiment of the present invention, the connection pattern disposed under the first sensing parts overlaps the branch portions and has a width less than that of each of the plurality of branch portions.

In an embodiment of the present invention, the connection pattern includes: a connection portion extending in the second direction between a k-th group and a (k+1)-th group; and extension portions extending from the connection portion and extending in the first direction between first and second light emitting devices, which are adjacent to the k-th and (k+1)-th groups, and the k-th and (k+1)-th groups, and wherein the connection portion is connected to the branch portion disposed between the k-th group and the (k+1)-th group, and where 'k' is a natural number.

In an embodiment of the present invention, the display device further includes: dummy electrodes disposed on a same layer as the connection pattern, and spaced apart from the connection pattern, wherein the dummy electrodes overlap each of the first sensing parts, and wherein the dummy electrodes have a width less than that of each of the first sensing parts, and are connected to each other, wherein the dummy electrodes receive a ground voltage.

In an embodiment of the present invention, the display device further includes: a black matrix disposed on each of the first sensing parts and overlapping the pixel defining layer.

In an embodiment of the present invention, the display device further includes: a plurality of dummy patterns disposed in openings defined in the first sensing parts and spaced apart from the first sensing parts, and wherein the dummy patterns receive a ground voltage.

In an embodiment of the present invention, the display device further includes: a data line; and a shielding layer disposed on the data line, and having a width greater than that of the data line, wherein the shielding layer overlaps the data line, and wherein each of the first, second, and third light emitting devices includes: a first electrode; a second electrode disposed on the first electrode; and an emission layer disposed between the first electrode and the second electrode, and wherein the shielding layer is disposed on a same layer as the first electrode and receives a ground voltage.

In an embodiment of the present invention, the display panel and the input sensing part are driven in units of frames, wherein the frame includes a plurality of display periods and a plurality of touch periods, wherein the display panel displays an image during the display periods, and the input sensing part senses an external input during the touch periods, and wherein, during the touch periods, a user's touch and a touch operation of a touch pen are alternately performed, and a driving frequency of the display panel and a driving frequency of the touch pen are different from each other.

In an embodiment of the present invention, the display panel includes: a first display area; and a second display area at least partially surrounding the first display area, and wherein the first display area has a light transmittance greater than that of the second display area, and wherein the input sensing part further includes a dummy sensing part disposed on the first display area and connected to the sensing part.

According to an embodiment of the present invention, a display device includes: a display panel including a plurality of first and second light emitting devices arranged in odd-numbered columns and a plurality of third light emitting devices arranged in even-numbered columns; and an input sensing part disposed on the display panel, and wherein the third light emitting devices are arranged adjacent to each other in pairs in each of the even-numbered columns, and are grouped into pairs to form a plurality of groups each of which includes the pair of third light emitting devices, wherein the input sensing part includes: first sensing parts arranged in a first direction; a connection pattern connected to the first sensing parts; second sensing parts arranged in the second direction crossing the first direction; and an extension pattern extending from the second sensing parts, and wherein the connection pattern is connected to first sensing parts between a k-th group and a (k+1)-th group among the plurality of groups disposed under the first sensing parts, and where 'k' is a natural number.

In an embodiment of the present invention, the connection pattern is disposed under the first and second sensing parts, and a width of the connection pattern is less than a width of the first and second sensing parts.

In an embodiment of the present invention, each of the first sensing parts includes a plurality of branch portions disposed between the first, second, and third light emitting devices and extending in the first direction and the second direction, without overlapping the first, second, and third light emitting devices, wherein a first width in the second direction of a branch portion, of the plurality of branch portions, disposed between the pair of first and second light emitting devices and a corresponding third light emitting device is greater than a second width in the first direction of a branch portion, of the plurality of branch portions, disposed between the pair of first and second light emitting devices, and wherein a third width in the first direction of a branch portion, of the plurality of branch portions, disposed between a third light emitting device of the k-th group and a third light emitting device of the (k+1)-th group facing each other in the first direction is greater than the first width.

BRIEF DESCRIPTION OF THE DRAWINGS

The above and other features of the present invention will become apparent by describing in detail embodiments thereof with reference to the accompanying drawings, in which:

FIG. 14C is a diagram illustrating a configuration of a connection pattern, according to an embodiment of the present invention.

DETAILED DESCRIPTION OF THE EMBODIMENTS

Figure 1:
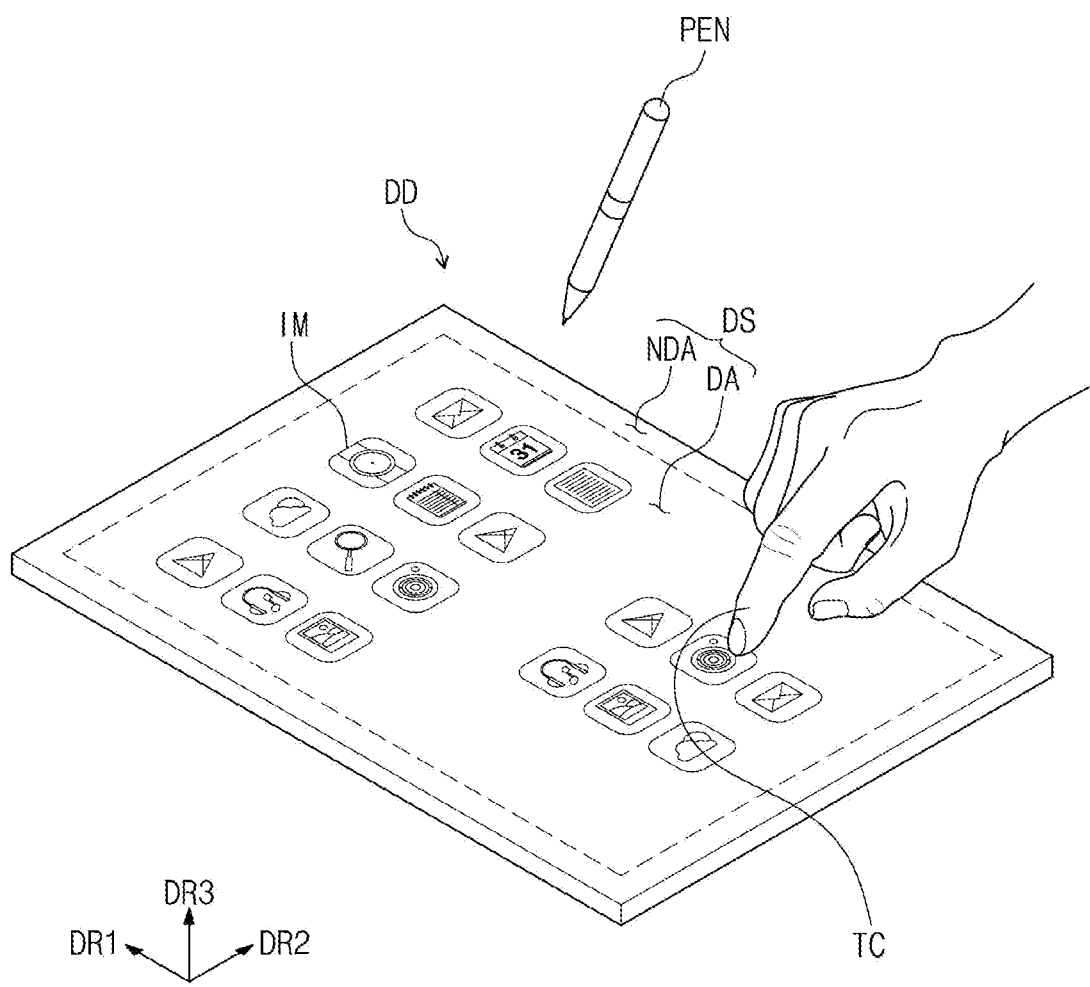
FIG. 1 is a block diagram of a display device, according to an embodiment of the present invention.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components throughout the specification. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown.

The term "and/or" includes one or more combinations of one or more of the associated listed items.

The terms "first", "second", etc. are used to describe various components, but the components are not limited by the terms. The terms are used only to differentiate one component from another component. For example, a first component may be named as a second component, and vice versa, without departing from the spirit or scope of the present invention. A singular form, unless otherwise stated, includes a plural form.

In addition, the terms "under", "beneath", "on", "above" are used to describe a relationship between components illustrated in a drawing. The terms are relative and are described with reference to a direction indicated in the drawing. It will be understood that the spatially relative terms are intended to encompass different orientations of the device in use or operation in addition to the orientation depicted in the figures. For example, if the device in the figures is turned over, components described as "below" or "beneath" other components or features would then be oriented "above" the other components or features.

Hereinafter, embodiments of the present invention will be described with reference to accompanying drawings.

FIG. 1 is a block diagram of a display device, according to an embodiment of the present invention.

Referring to FIG. 1, a display device DD according to an embodiment of the present invention may have a rectangular shape having long sides in a first direction DR1 and short sides in a second direction DR2 crossing the first direction DR1. However, the present invention is not limited thereto, and the display device DD may have various shapes, such as a circular shape or a polygonal shape.

Hereinafter, a direction substantially perpendicular to a plane defined by the first direction DR1 and the second direction DR2 is defined as a third direction DR3. In addition, in the present specification, "when viewed in a plan view" may be defined as a state viewed in the third direction DR3.

The upper surface of the display device DD may be defined as a display surface DS and may have a plane defined by the first direction DR1 and the second direction DR2. Images IM generated by the display device DD may be provided to a user through the display surface DS.

The display surface DS may include a display area DA and a non-display area NDA around the display area DA. The display area DA may display an image, and the non-display area NDA might not display an image. The non-display area NDA may be adjacent to the display area DA. For example, the non-display area NDA may surround the display area DA and may define a border of the display device DD.

The display device DD may sense inputs applied from the outside of the display device DD. For example, the display device DD may sense a first input from a touch pen PEN and a second input from a touch TC (e.g., a touch from a body part). The touch pen PEN may be an input device.

The touch pen PEN may be an active pen that outputs a signal. The second input by the touch TC may include various types of external inputs such as a part of a user's body, light, heat, or pressure.

The display device DD and the touch pen PEN may communicate in bi-directions. The display device DD may provide an uplink signal to the touch pen PEN. For example, the uplink signal may include information such as panel information and protocol version, but is not particularly limited thereto.

The touch pen PEN may provide a downlink signal to the display device DD. The downlink signal may include a synchronization signal or status information of the touch pen PEN. For example, the downlink signal may include coordinate information of the touch pen PEN, battery information of the touch pen PEN, tilt information of the touch pen PEN, and/or various information stored in the touch pen PEN. However, the present invention is not particularly limited thereto.

Figure 2:
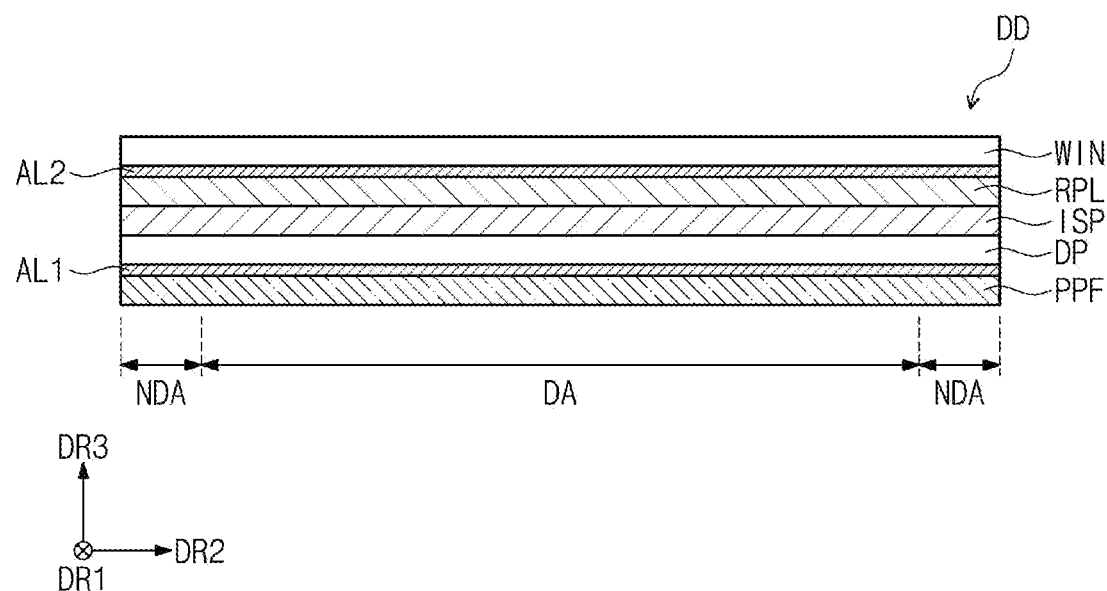
FIG. 2 is a diagram illustrating a cross-section of a display device illustrated in FIG. 1.

FIG. 2 is a diagram illustrating a cross-section of a display device illustrated in FIG. 1.

For example, FIG. 2 illustrates a cross-section of the display device DD viewed in the first direction DR1.

Referring to FIG. 2, the display device DD may include a display panel DP, an input sensing part ISP, a reflection prevention layer RPL, a window WIN, a panel protection film PPF, and first and second adhesive layers AL1 and AL2.

The display panel DP according to an embodiment of the present invention may be a light emitting display panel, and is not particularly limited thereto. For example, the display panel DP may be an organic light emitting display panel or an inorganic light emitting display panel. An emission layer of the organic light emitting display panel may include an organic light emitting material. An emission layer of the inorganic light emitting display panel may include quantum dots and quantum rods. Hereinafter, it is described that the display panel DP is an organic light emitting display panel.

The input sensing part ISP may be disposed on the display panel DP. The input sensing part ISP may include a plurality of sensing parts for sensing an external input in an electrostatic capacitive manner. For example, the input sensing part ISP may be directly manufactured on the display panel DP when the display device DD is manufactured. However, the present invention is not limited thereto, and the input sensing part ISP may be manufactured as a separate panel from the display panel DP, and may be attached to the display panel DP by an adhesive layer.

The reflection prevention layer RPL may be disposed on the input sensing part ISP. For example, the reflection prevention layer RPL may be directly manufactured on the input sensing part ISP when the display device DD is manufactured. The reflection prevention layer RPL may be an external light anti-reflection layer. The reflection prevention layer RPL may reduce reflectance of external light incident toward the display panel DP from the top of the display device DD. External light might not be perceived by the user due to the reflection prevention layer RPL.

When the external light propagating toward the display panel DP is reflected by the display panel DP and provided to an external user again, the user may perceive the external light like a mirror. To prevent this phenomenon, for example, the reflection prevention layer RPL may include a plurality of color filters that display the same color as the pixels of the display panel DP. The color filters may filter external light to the same color as the pixels. In this case, the external light may not be perceived by the user.

In an embodiment of the present invention, the reflection prevention layer RPL may be manufactured as a separate panel and may be attached to the input sensing part ISP by an adhesive layer. In this case, the reflection prevention layer RPL may be made of a polarizing film and may be attached to the input sensing part ISP. For example, the polarizing film may include a retarder and/or a polarizer to reduce the reflectance of external light.

The window WIN may be disposed on the reflection prevention layer RPL. The window WIN may protect the display panel DP, the input sensing part ISP, and the reflection prevention layer RPL from external scratches and impacts.

The panel protection film PPF may be disposed on the display panel DP. For example, the panel protection film PPF may be disposed under the display panel DP. The panel protection film PPF may protect the lower portion of the display panel DP. The panel protection film PPF may include a flexible plastic material such as polyethylene terephthalate (PET).

The first adhesive layer AL1 may be disposed between the display panel DP and the panel protection film PPF, and the display panel DP and the panel protection film PPF may be bonded to each other by the first adhesive layer AL1. The second adhesive layer AL2 may be disposed between the window WIN and the reflection prevention layer RPL, and the window WIN and the reflection prevention layer RPL may be bonded to each other by the second adhesive layer AL2.

Figure 3:
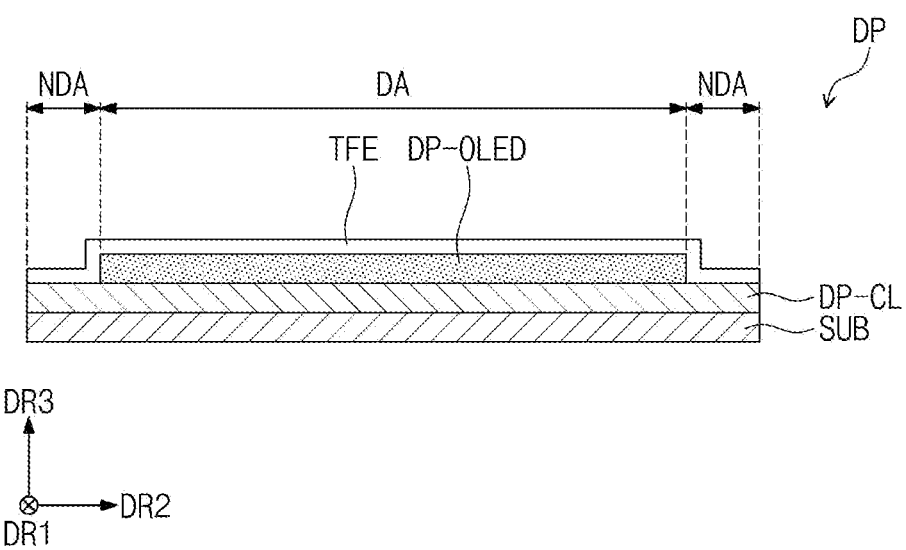
FIG. 3 is a diagram illustrating a cross-section of a display panel illustrated in FIG. 2.

FIG. 3 is a diagram illustrating a cross-section of a display panel illustrated in FIG. 2.

For example, FIG. 3 illustrates a cross-section of the display panel DP viewed in the first direction DR1.

Referring to FIG. 3, the display panel DP may include a substrate SUB, a circuit element layer DP-CL disposed on the substrate SUB, and a display element layer DP-OLED disposed on the circuit element layer DP-CL, and a thin film encapsulation layer TFE disposed on the display element layer DP-OLED.

The substrate SUB may include the display area DA and the non-display area NDA around the display area DA. The substrate SUB may include, for example, glass. The display element layer DP-OLED may be disposed on the display area DA.

A plurality of pixels may be disposed in the circuit element layer DP-CL and the display element layer DP-OLED. Each of the pixels may include a transistor that is disposed on the circuit element layer DP-CL and a light emitting device that is disposed on the display element layer DP-OLED and that is connected to the transistor.

The thin film encapsulation layer TFE may be disposed on the circuit element layer DP-CL to cover the display element layer DP-OLED. The thin film encapsulation layer TFE may protect the pixels from moisture, oxygen, and external foreign substances.

Figure 4:
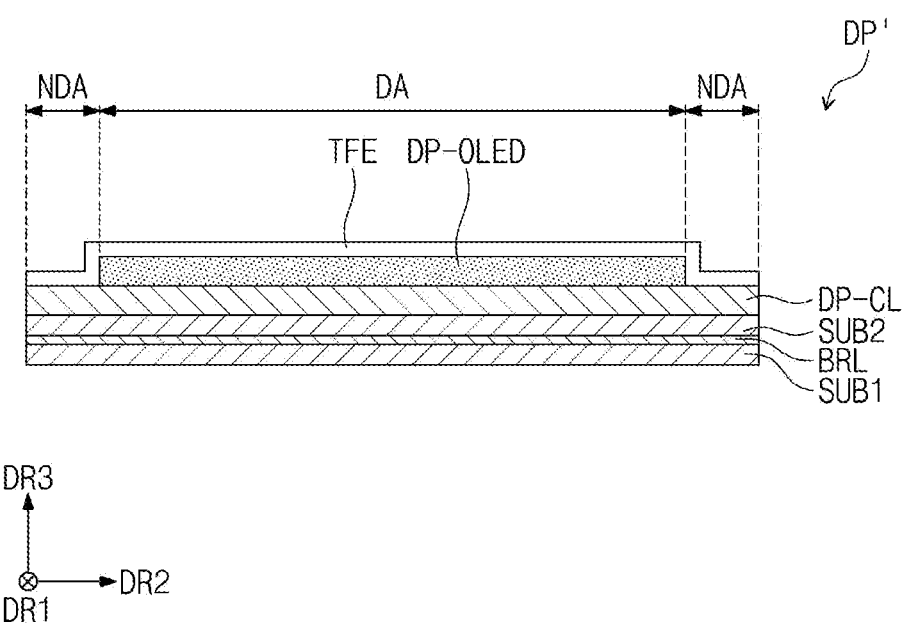
FIG. 4 is a diagram illustrating a cross-section of a display panel illustrated in FIG. 2, according to an embodiment of the present invention.

FIG. 4 is a diagram illustrating a cross-section of a display panel illustrated in FIG. 2, according to an embodiment of the present invention.

Referring to FIG. 4, a display panel DP' may include a first substrate SUB1, a second substrate SUB2 disposed on the first substrate SUB1, and a barrier layer BRL disposed between the first substrate SUB1 and the second substrate SUB2. The first substrate SUB1 and the second substrate SUB2 may include polyimide (PI) as a flexible plastic material. The barrier layer BRL may include an inorganic insulating layer.

The circuit element layer DP-CL, the display element layer DP-OLED, and the thin film encapsulation layer TFE may be disposed on the second substrate SUB2. Since the circuit element layer DP-CL, the display element layer DP-OLED, and the thin film encapsulation layer TFE are the same as the circuit element layer DP-CL, the display element layer DP-OLED, and the thin film encapsulation layer TFE in FIG. 3, additional descriptions will be omitted to avoid redundancy.

Figure 5:
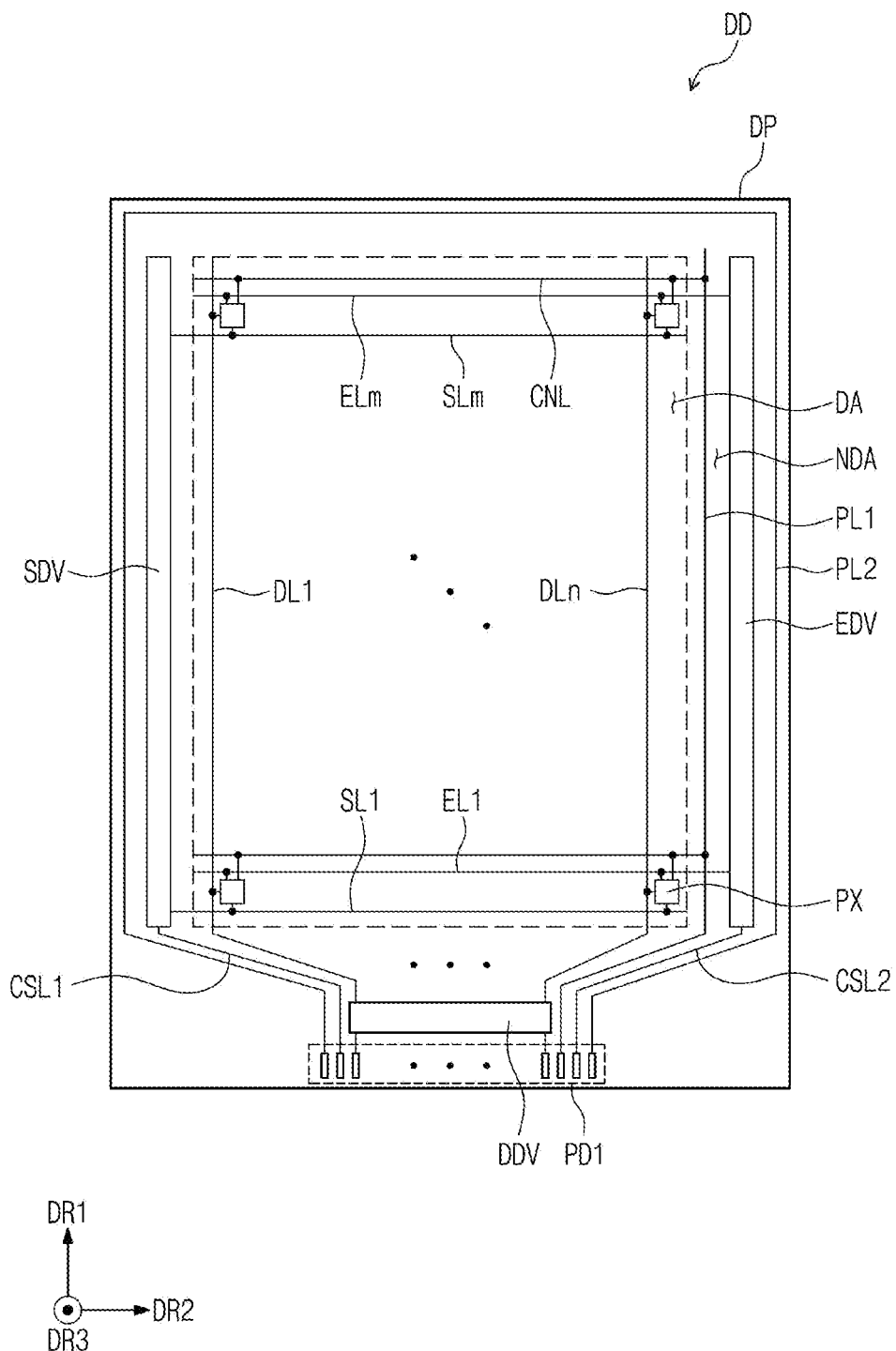
FIG. 5 is a plan view of a display panel illustrated in FIG. 2.

FIG. 5 is a plan view of a display panel illustrated in FIG. 2.

Referring to FIG. 5, the display device DD may include the display panel DP, a scan driver SDV, a data driver DDV, a light emission driver EDV, and a plurality of first pads PD.

The display panel DP may have a rectangular shape having long sides extending in the first direction DR1 and short sides extending in the second direction DR2, but the shape of the display panel DP is not limited thereto. The display panel DP may include the display area DA and the non-display area NDA at least partially surrounding the display area DA.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, and connection lines CNL. Wherein, the 'm' and 'n' are natural numbers.

The pixels PX may be disposed in the display area DA. The scan driver SDV and the light emission driver EDV may be disposed in the non-display area NDA adjacent to the long sides of the display panel DP, respectively. The data driver DDV may be disposed in the non-display area NDA adjacent to one of the short sides of the display panel DP. When viewed in a plan view, the data driver DDV may be adjacent to the lower end of the display panel DP; however, the present invention is not limited thereto. For example, the data driver DDV may be adjacent to a long side of the display panel DP.

The scan lines SL1 to SLm may extend in the second direction DR2 to be connected to the pixels PX and the scan driver SDV. The data lines DL1 to DLn may extend in the first direction DR1 to be connected to the pixels PX and the data driver DDV. The emission lines EL1 to ELm may extend in the second direction DR2 to be connected to the pixels PX and the light emission driver EDV.

The first power line PL1 may extend in the first direction DR1 and may be disposed in the non-display area NDA. The first power line PL1 may be disposed between the display area DA and the light emission driver EDV.

The connection lines CNL extend in the second direction DR2 and are arranged in the first direction DR1 to be connected to the first power line PL1 and the pixels PX. A first voltage may be applied to the pixels PX through the first power line PL1 and the connection lines CNL connected to each other.

The second power line PL2 is disposed in the non-display area NDA and may extend along long sides of the display panel DP and the other short side of the display panel DP on which the data driver DDV is not disposed. The second power line PL2 may be disposed outside the scan driver SDV and the light emission driver EDV.

The second power line PL2 may extend toward the display area DA and may be connected to the pixels PX. A second voltage having a level lower than that of the first voltage may be applied to the pixels PX through the second power line PL2.

The first control line CSL1 may be connected to the scan driver SDV and extend toward a lower end of the display panel DP from the scan driver SDV. The second control line CSL2 may be connected to the light emission driver EDV and extend toward a lower end of the display panel DP from the light emission driver EDV. The data driver DDV may be disposed between the first control line CSL1 and the second control line CSL2.

The first pads PD1 may be disposed in the non-display area NDA adjacent to the lower end of the display panel DP, and may be closer to the lower end of the display panel DP than to the data driver DDV. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

The display device DD may further include a timing controller for controlling operations of the scan driver SDV, the data driver DDV, and the light emission driver EDV. The display device DD may further include a voltage generator for generating first and second voltages. The timing controller and the voltage generator may be connected to the first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of emission signals, and the emission signals may be applied to the pixels PX through the emission lines EL1 to ELm.

The pixels PX may receive the data voltages in response to the scan signals. The pixels PX may display an image by emitting light having a luminance corresponding to the data voltages in response to the emission signals.

Figure 6:
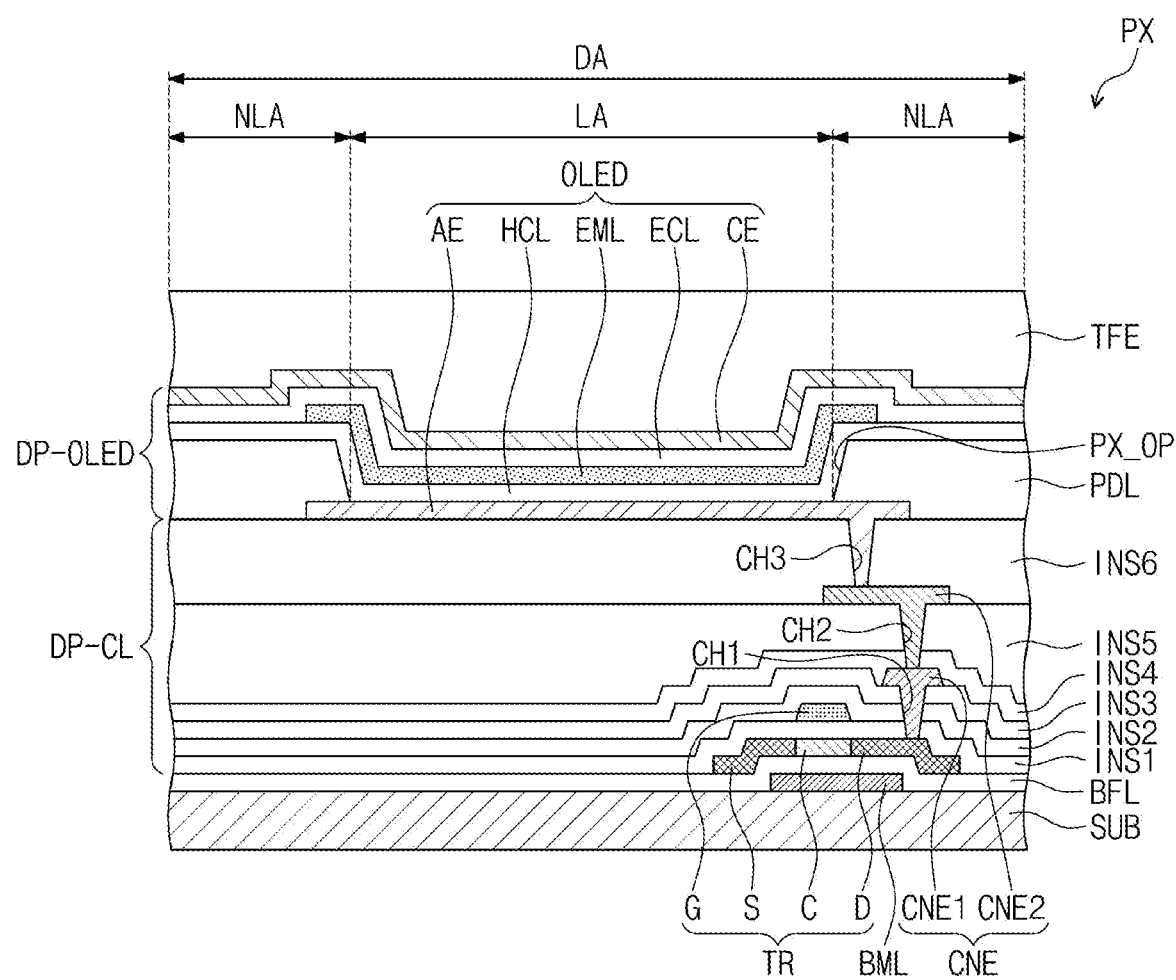
FIG. 6 is a diagram illustrating a cross-section of a display panel corresponding to any one pixel illustrated in FIG. 5.

FIG. 6 is a diagram illustrating a cross-section of a display panel corresponding to any one pixel illustrated in FIG. 5.

Referring to FIG. 6, the pixel PX may include a transistor TR and a light emitting device OLED. The light emitting device OLED may include a first electrode AE (or, e.g., an anode), a second electrode CE (or, e.g., a cathode), a hole control layer HCL, an electron control layer ECL, and an emission layer EML.

The transistor TR and the light emitting device OLED may be disposed on the substrate SUB. Although one transistor TR is illustrated by way of example, the pixel PX may include a plurality of transistors and at least one capacitor for driving the light emitting device OLED.

The display area DA may include an emission area LA and a non-emission area NLA. The emission area LA corresponds to each of the pixels PX, and the non-emission area NLA is around the emission area LA. The light emitting device OLED may be disposed in the emission area LA.

A dummy pattern BML including a conductive material may be disposed on the substrate SUB. When viewed in a plan view, the dummy pattern BML may overlap the transistor TR. The dummy pattern BML may be connected to the first power line PL1 to receive the first voltage. When a preset voltage is applied to the dummy pattern BML, a value of a threshold voltage Vth of the transistor TR, which is disposed on the dummy pattern BML, may be maintained without changing. The dummy pattern BML may be omitted.

A buffer layer BFL is disposed on the substrate SUB, and the buffer layer BFL may be an inorganic layer. The buffer layer BFL may cover the dummy pattern BML. A semiconductor pattern may be disposed on the buffer layer BFL. The semiconductor pattern may include, for example, polysilicon, amorphous silicon, or metal oxide.

The semiconductor pattern may be doped with an N-type dopant or a P-type dopant. The semiconductor pattern may include a highly doped area and a lightly doped area. Conductivity of the highly doped area may be greater than that of the lightly doped area. The highly doped area may actually operate as a source electrode or a drain electrode of the transistor TR. The lightly doped area may actually correspond to an active (or a channel) of the transistor TR.

A source S, an active A, and a drain D of the transistor TR may be formed from a semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to connect the transistor TR and the light emitting device OLED to each other. The first connection electrode CNE1 may be disposed on the third insulating layer INS3 and may be connected to the drain D through a first contact hole CH1 provided in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 provided in the fourth and fifth insulating layers INS4 and INS5.

A sixth insulating layer INS6 may be disposed on the second connection electrode CNE2. Layers from the buffer layer BFL to the sixth insulating layer INS6 may be included in a circuit element layer DP-CL. The first to sixth insulating layers INS1 to INS6 may be inorganic layers or organic layers.

The first electrode AE may be disposed on the sixth insulating layer INS6. The first electrode AE may be connected to the second connection electrode CNE2 through a third contact hole CH3 provided in the sixth insulating layer INS6. A pixel defining layer PDL, which includes an opening PX_OP for exposing a predetermined portion of the first electrode AE, may be disposed on the first electrode AE and the sixth insulating layer INS6.

The hole control layer HCL may be disposed on the first electrode AE and the pixel defining layer PDL. The hole control layer HCL may include a hole transport layer and a hole injection layer.

The emission layer EML may be disposed on the hole control layer HCL. The emission layer EML may be disposed in an area corresponding to the opening PX_OP. The emission layer EML may include an organic material and/or an inorganic material. The emission layer EML may generate any one of red, green, or blue light.

The electron control layer ECL may be disposed on the emission layer EML and the hole control layer HCL. The electron control layer ECL may include an electron transport layer and an electron injection layer. The hole control layer HCL and the electron control layer ECL may be disposed in common in the emission area LA and the non-emission area NLA. For example, the hole control layer HCL and the electron control layer ECL may each extend continuously throughout the emission area LA and the non-emission area NLA.

The second electrode CE may be disposed on the electron control layer ECL. The second electrode CE may be disposed in the pixels PX in common. For example, the second electrode CE may be a common electrode. A layer in which the light emitting device OLED is disposed may be the display element layer DP-OLED.

The thin film encapsulation layer TFE may be disposed on the light emitting device OLED. The thin film encapsulation layer TFE may include an inorganic layer, an organic layer, and an inorganic layer, which are sequentially stacked. The inorganic layers may include an inorganic material and may protect pixels from moisture or oxygen. The organic layer may include an organic material and may protect the pixels PX from foreign substances such as dust particles.

The first voltage may be applied to the first electrode AE through the transistor TR, and the second voltage may be applied to the second electrode CE. Excitons may be formed by coupling holes to electrons that are both injected into the emission layer EML. As the excitons transition to a ground state, the light emitting device OLED may emit light.

Figure 7:
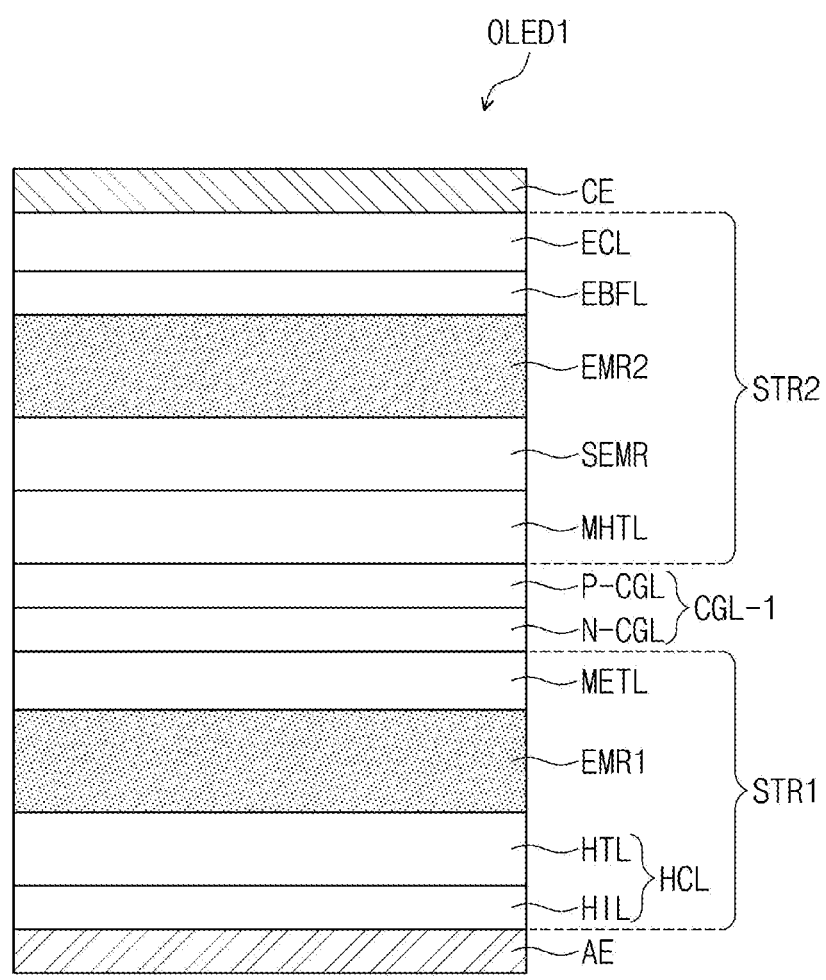
FIGS. 7, 8, and 9 are cross-sectional views of a light emitting device illustrating more detailed stacked structures of a light emitting device illustrated in FIG. 6.
Figure 8:
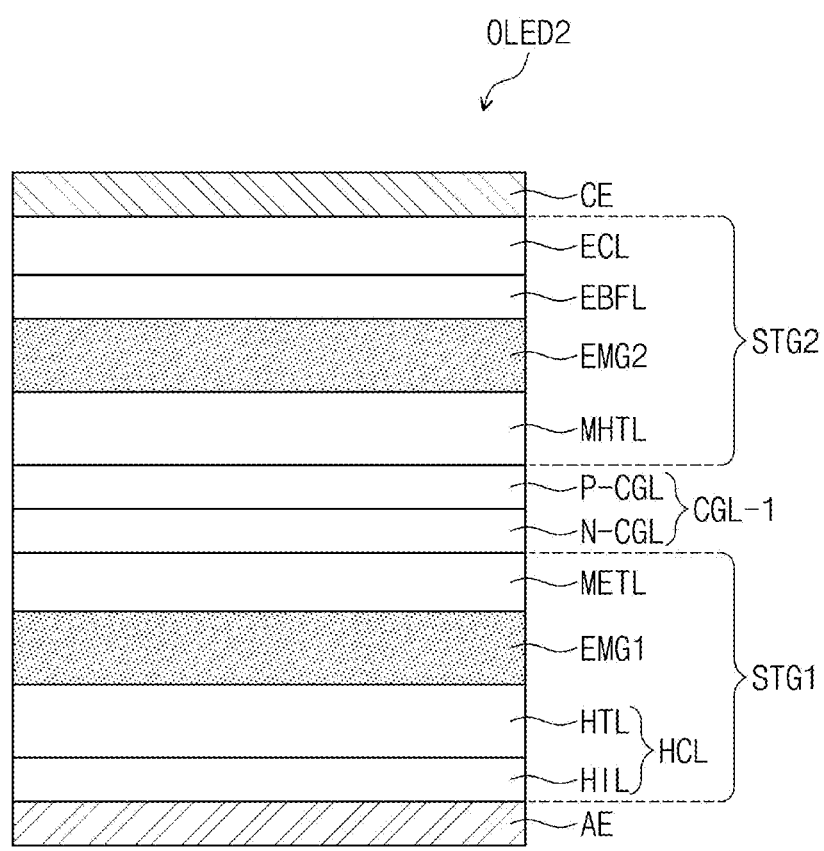
Figure 9:
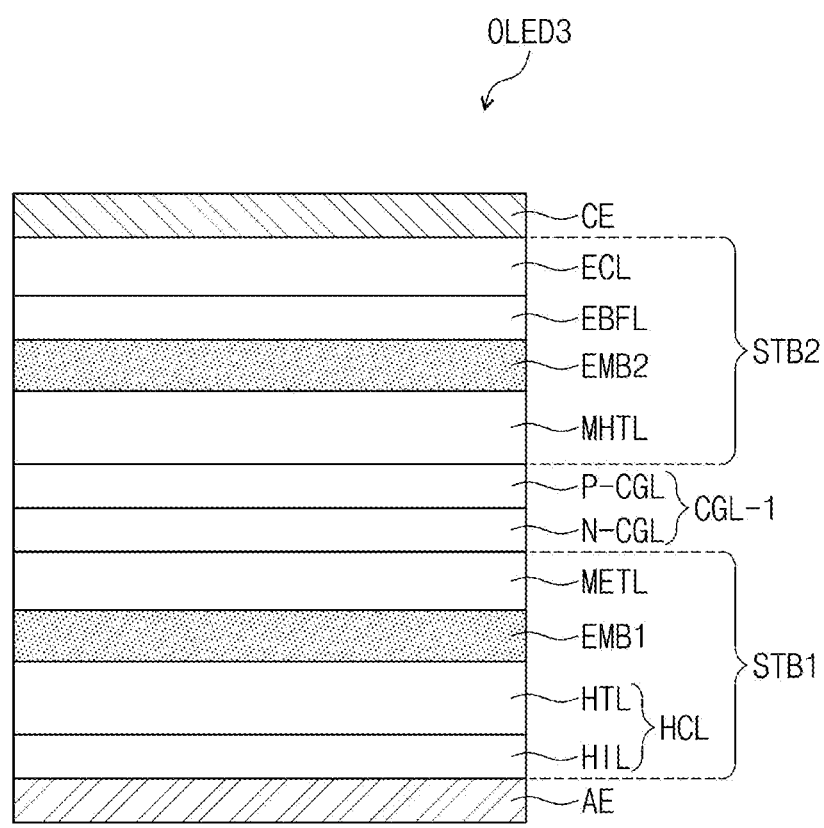

FIGS. 7, 8, and 9 are cross-sectional views of a light emitting device illustrating more detailed stacked structures of a light emitting device illustrated in FIG. 6.

Referring to FIGS. 7, 8, and 9, the light emitting device OLED illustrated in FIG. 8 may be any one of a first light emitting device OLED1, a second light emitting device OLED2, and a third light emitting device OLED3. The first light emitting device OLED1 may emit red color (e.g., a first color), the second light emitting device OLED2 may emit green color (e.g., a second color), and the third light emitting device OLED3 may emit blue color (e.g., a third color).

Each of the first light emitting device OLED1, the second light emitting device OLED2, and the third light emitting device OLED3 may commonly include the hole control layer HCL, an intermediate electron transport layer METL, a charge generation layer CGL-1, an intermediate hole transport layer MHTL, a buffer layer EBFL, the electron control layer ECL, and the second electrode CE. Common layers such as the hole control layer HCL, the intermediate electron transport layer METL, the charge generation layer CGL-1, the intermediate hole transport layer MHTL, the buffer layer EBFL, the electron control layer ECL, and the second electrode CE may be commonly formed in the pixels PX.

Some of the light emitted from the first, second, and third light emitting devices OLED1, OLED2, and OLED3 may have primary resonance, and others may have secondary resonance. The thickness of the second electrode CE may be about 120 angstroms, and thus a strong resonance structure may be implemented.

The hole control layer HCL may include a hole injection layer HIL and a hole transport layer HTL disposed on the hole injection layer HIL. The charge generation layer CGL-1 may include an n-type charge generation layer N-CGL and a p-type charge generation layer P-CGL. The p-type charge generation layer P-CGL may be a charge generation layer that provides holes to adjacent stacks. The n-type charge generation layer N-CGL may be a charge generation layer that provides electrons to adjacent stacks.

Each of the first, second, and third light emitting devices OLED1, OLED2, and OLED3 may include at least two stacks STR1 and STR2 disposed between the first electrode AE and the second electrode CE. For example, the first stack STR1 may be disposed between the first electrode AE and the charge generation layer CGL-1, and the second stack STR2 may be disposed between the charge generation layer CGL-1 and the second electrode CE.

Referring to FIG. 7, the first stack STR1 of the first light emitting device OLED1 may include the hole control layer HCL, a first red light emitting layer EMR1, and the intermediate electron transport layer METL, and the second stack STR2 of the first light emitting device OLED1 may include the intermediate hole transport layer MHTL, an auxiliary layer SEMR, a second red emission layer EMR2, the buffer layer EBFL, and an electronic control layer ECL.

When the emission layer EML illustrated in FIG. 6 emits red light, the emission layer EML illustrated in FIG. 6 may include the first and second red emission layers EMR1 and EMR2 illustrated in FIG. 7. The auxiliary layer SEMR may serve to adjust the resonance distance such that light may be extracted with maximum efficiency.

Referring to FIG. 8, a first stack STG1 of the second light emitting device OLED2 may include the hole control layer HCL, a first green light emitting layer EMG1, and the intermediate electron transport layer METL, and a second stack STG2 of the second light emitting device OLED2 may include the intermediate hole transport layer MHTL, a second green emitting layer EMG2, the buffer layer EBFL, and the electronic control layer ECL.

When the emission layer EML illustrated in FIG. 6 emits green light, the emission layer EML illustrated in FIG. 6 may include the first and second green emission layers EMG1 and EMG2 illustrated in FIG. 8. The second light emitting device OLED2 might not include an auxiliary layer. Accordingly, the second green emission layer EMG2 may be disposed on the intermediate hole transport layer MHTL.

Referring to FIG. 9, a first stack STB1 of the third light emitting device OLED3 may include the hole control layer HCL, a first blue light emitting layer EMB1, and the intermediate electron transport layer METL, and a second stack STB2 of the third light emitting device OLED3 may include the intermediate hole transport layer MHTL, a second blue emission layer EMB2, the buffer layer EBFL, and the electronic control layer ECL.

When the emission layer EML illustrated in FIG. 6 emits blue light, the emission layer EML illustrated in FIG. 6 may include the first and second blue emission layers EMB1 and EMB2 illustrated in FIG. 9.

The thicknesses of the first red light emitting layer EMR1, the first green light emitting layer EMG1, and the first blue light emitting layer EMB1 may be different from each other, and the thicknesses of the second red light emitting layer EMR2, the second green light emitting layer EMG2, and the second blue light emitting layer EMB2 may be different from each other.

For example, the thickness of the first red light emitting layer EMR1 may be greater than the thickness of the first green light emitting layer EMG1, and the thickness of the first green light emitting layer EMG1 may be greater than the thickness of the first blue light emitting layer EMB1. For example, the thickness of the second red light emitting layer EMR2 may be greater than the thickness of the second green light emitting layer EMG2, and the thickness of the second green light emitting layer EMG2 may be greater than the thickness of the second blue light emitting layer EMB2.

Figure 10A:
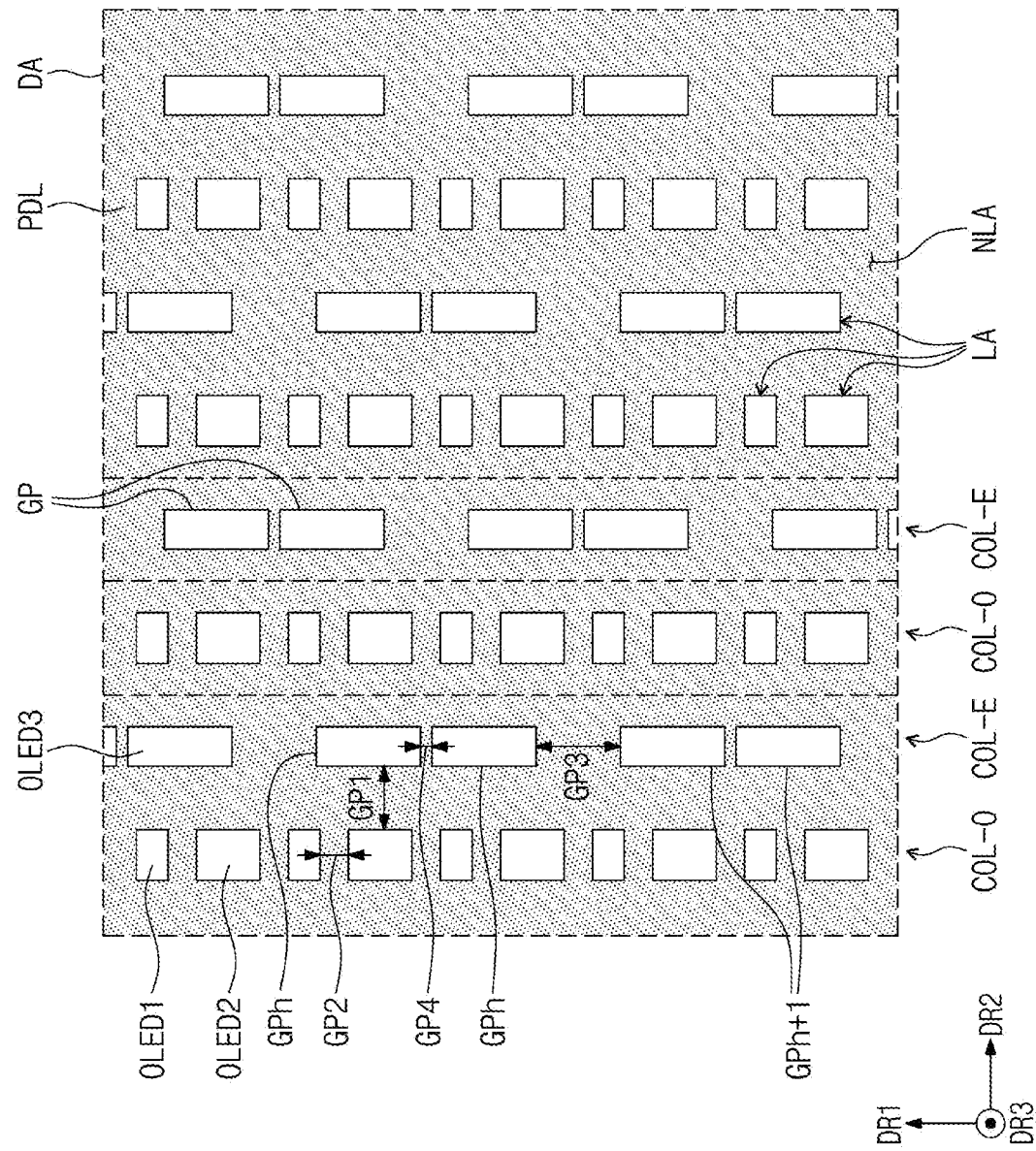
FIG. 10A is a diagram illustrating an arrangement state on a plane of the first, second, and third light emitting devices illustrated in FIGS. 7, 8, and 9.

FIG. 10A is a diagram illustrating an arrangement state on a plane of the first, second, and third light emitting devices illustrated in FIGS. 7, 8, and 9.

Referring to FIGS. 5 and 10A, the plurality of first light emitting devices OLED1, the plurality of second light emitting devices OLED2, and the plurality of third light emitting devices OLED3 may be disposed in the display area DA illustrated in FIG. 5. For example, the display panel DP may include the plurality of first, second, and third light emitting devices OLED1, OLED2, and OLED3 disposed in the display area DA. For example, FIG. 10A is a diagram illustrating a part of the display area DA illustrated in FIG. 5.

Each of the first, second, and third light emitting devices OLED1, OLED2, and OLED3 may be disposed in the emission area LA. The pixel defining layer PDL illustrated in FIG. 6 may be disposed between the first, second, and third light emitting devices OLED1, OLED2, and OLED3. The pixel defining layer PDL may be disposed in the non-emission area NLA. The first, second, and third light emitting devices OLED1, OLED2, and OLED3 may be separated from each other by the pixel defining layer PDL.

When viewed in a plan view, the second light emitting devices OLED2 may have a larger area than the first light emitting devices OLED1. When viewed in a plan view, the third light emitting devices OLED3 may have a larger area than the second light emitting devices OLED2.

When the third light emitting devices OLED3, which has a relatively lower emission efficiency than those of the first and second light emitting devices OLED1 and OLED2, include two blue light emitting layers EMB1 and EMB2 as described in FIG. 9, the emission efficiency of the third light emitting devices OLED3 may be increased. As a result, the lifespan of the third light emitting devices OLED3 may be increased.

Hereinafter, the first direction DR1 corresponds to a column direction, and the second direction DR2 corresponds to a row direction.

Referring to FIG. 10A, the first light emitting devices OLED1 and the second light emitting devices OLED2 may be arranged in odd-numbered columns COL-O. The third light emitting devices OLED3 may be arranged in even-numbered columns COL-E.

In each of the odd-numbered columns COL-O, the first light emitting devices OLED1 and the second light emitting devices OLED2 may be alternately arranged in the first direction DR1. In the odd-numbered columns COL-O, the first light emitting devices OLED1 may be arranged in the same row. In the odd-numbered columns COL-O, the second light emitting devices OLED2 may be arranged in the same row.

The third light emitting devices OLED3 may be disposed adjacent to each other in pairs in each of the even-numbered columns COL-E. Hereinafter, a pair of third light emitting devices OLED3 adjacent to each other is defined as a group GP. For example, the third light emitting devices OLED3 may be grouped into a plurality of groups GP each including the pair of third light emitting devices OLED3.

Since the pair of third light emitting devices OLED3 of each of the groups GP are disposed adjacent to each other, a distance between the groups GP may be further spaced apart. For example, a distance between two adjacent groups GP in the first direction DR1 may be greater than a distance between a pair of third light emitting devices OLED3 in the first direction DR1.

A pair of first and second light emitting devices OLED1 and OLED2 adjacent to each other among the first and second light emitting devices OLED1 and OLED2 may be disposed adjacent to the corresponding third light emitting device OLED3 among the third light emitting devices OLED3 in the second direction DR2. For example, three first light emitting devices OLED1, the second light emitting device OLED2, and the third light emitting device OLED3 may be disposed adjacent to each other.

In two even-numbered columns COL-E adjacent to each other, the groups GP may be disposed to be staggered. For example, the groups GP in the first even-numbered column and the groups GP in the second even-numbered column are not disposed in the same row, but may be disposed to be staggered or misaligned with each other.

A distance in the second direction DR2 between the pair of first and second light emitting devices OLED1 and OLED2 and the third light emitting device OLED3 corresponding to the pair of first and second light emitting devices OLED1 and OLED2 may be defined as a first distance GP1. For example, a distance in the second direction DR2 between the first light emitting device OLED1 and the third light emitting device OLED3 adjacent to each other may be defined as the first distance GP1. In addition, a distance in the second direction DR2 between the second light emitting device OLED2 and the third light emitting device OLED3 adjacent to each other may be defined as the first distance GPL.

A distance in the first direction DR1 between the pair of first light emitting device OLED1 and second light emitting device OLED2 may be defined as a second distance GP2. The first distance GP1 may be greater than the second distance GP2. The first distance GP1 and the second distance GP2 may be defined by a width of the pixel defining layer PDL. The pixel defining layer PDL may have a width of about 17 micrometers (μm) to about 21.8 micrometers (μm). For example, the first distance GP1 may be about 21.8 micrometers (μm), and the second distance GP2 may be about 18.5 micrometers.

In the present specification, the width may be defined as a numerical value of the corresponding configuration measured in a direction crossing the extension direction of the corresponding configuration when viewed in a plan view.

As described above, when the emission efficiency of the third light emitting devices OLED3 is increased, the size of the third light emitting devices OLED3 may be reduced to the size illustrated in FIG. 10A compared to the existing devices. In this case, the width of the pixel defining layer PDL may be relatively increased. For example, a width of the pixel defining layer PDL between the pair of first and second light emitting devices OLED1 and OLED2 and the third light emitting device OLED3 may be set to the first distance GP1 greater than the second distance GP2.

The input sensing part ISP disposed on the display panel DP may include sensing parts. The widths of the branch portions of the sensing parts disposed on the pixel defining layer PDL having the second distance GP2 lesser than the first distance GP1 may be increased. This configuration will be described in detail below.

A distance in the first direction DR1 between the third light emitting device OLED3 of a h-th group GPh and the third light emitting device OLED3 of a (h+1)-th group GPh+1 facing each other in the first direction DR1 may be defined as a third distance GP3. Where the 'h' is a natural number. The third distance GP3 may be greater than the first distance GP1 and the second distance GP2.

A distance in the first direction DR1 between the third light emitting devices OLED3 in each of the groups GP may be defined as a fourth distance GP4. The fourth distance GP4 may be lesser than the second distance GP2.

Table 1 below is a table illustrating aperture ratios and lifespans of the first, second, and third light emitting devices illustrated in FIGS. 7, 8, and 9.

TABLE 1

| Division | | OLED1 | OLED2 | OLED3 |
|---|---|---|---|---|
| Aperture ratio (%) | | 21.8 | 45.97 | 64.86 |
| Lifespan | Target | 4000 | 4000 | 2400 |
| | After change | 4700 | 4000 | 5100 |
| Improvement rate (compared to target) | | X1.2 | X1.0 | X2.1 |

Referring to Table 1, the aperture ratio may indicate an arrangement area of light emitting devices disposed in a corresponding column. For example, in FIG. 10A, one odd-numbered column COL-O and one even-numbered column COL-E adjacent to each other in the second direction DR2 are separated by a dotted line. An area between the dotted line may be defined as an area of the odd-numbered column COL-O and an area of the even-numbered column COL-E. Based on the dotted line area, an arrangement area of the first light emitting devices OLED1 disposed in the odd-numbered column COL-O may be about 21.8% of the area of the odd-numbered column COL-O. The arrangement area of the second light emitting devices OLED2 disposed in the odd-numbered column COL-O may be about 45.97% of the area of the odd-numbered column COL-O. The pixel defining layer PDL may be disposed in a portion where the first and second light emitting devices OLED1 and OLED2 are not disposed. Based on the dotted line area, the arrangement area of the third light emitting devices OLED3 disposed in the even-numbered column COL-E may be about 64.86% of the area of the even-numbered column COL-E.

In Table 1, the unit of lifespan may be a unit of measure for time. The target may be the lifespan of the first, second, and third light emitting devices when each of the first, second, and third light emitting devices includes a single light emitting layer. "After change", in Table 1, may indicate the lifespan of the first, second, and third light emitting devices OLED1, OLED2, and OLED3 illustrated in FIGS. 7, 8, and 9 each including two light emitting layers.

After the structure is changed to the structure illustrated in FIGS. 7 and 9, the lifespan of the first light emitting device OLED1 may be increased by about 1.2 times (×1.2), and the lifespan of the third light emitting device OLED3 may be increased by about 2.1 times. For example, the efficiency of the first and third light emitting devices OLED1 and OLED3 may be increased.

Figure 10B:
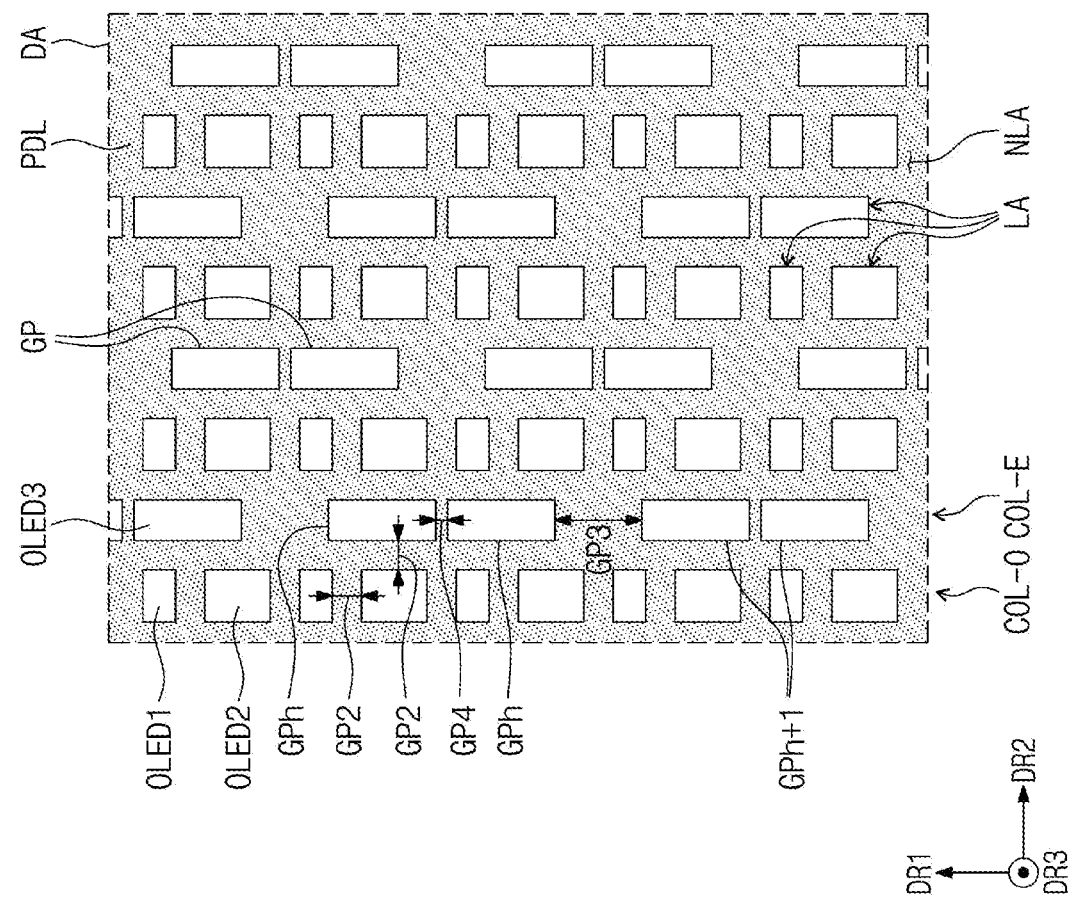
FIG. 10B is a diagram illustrating an arrangement state of first, second, and third light emitting devices, according to an embodiment of the present invention.

FIG. 10B is a diagram illustrating an arrangement state of first, second, and third light emitting devices, according to an embodiment of the present invention.

Hereinafter, the first, second, and third light emitting devices OLED1, OLED2, and OLED3 illustrated in FIG. 10B will be mainly described with reference to a structure different from that illustrated in FIG. 10A.

Referring to FIG. 10B, an arrangement state of the first, second, and third light emitting devices OLED1, OLED2, and OLED3 may be the same as that of FIG. 10A. However, a distance in the second direction DR2 between the first light emitting device OLED1 and the third light emitting device OLED3 adjacent to each other may be the second distance GP2 and not a first distance GP1, as illustrated in FIG. 10A. In addition, a distance in the second direction DR2 between the second light emitting device OLED2 and the third light emitting device OLED3 adjacent to each other may be the second distance GP2 and not a first distance GP1, as illustrated in FIG. 10A.

Unlike FIG. 10A, the distance between the pair of first and second light emitting devices OLED1 and OLED2 and the third light emitting device OLED3 may be the same as the distance between the pair of first and second light emitting devices OLED1 and OLED2. A distance between the pair of first and second light emitting devices OLED1 and OLED2 and the third light emitting device OLED3 may be narrower in FIG. 10B than the distance illustrated in FIG. 10A.

As illustrated in Table 1, when the efficiency of the first and third light emitting devices OLED1 and OLED3 is increased, when the distance between the first and third light emitting devices OLED1 and OLED3 is narrowed, the first light emitting device OLED1 adjacent to the third light emitting device OLED3 may also be driven when the third light emitting device OLED3 is driven. To prevent this phenomenon, a distance between the first and third light emitting devices OLED1 and OLED3 may be expanded.

To extend the distance between the first and third light emitting devices OLED1 and OLED3, the width of the pixel defining layer PDL between the first and third light emitting devices OLED1 and OLED3 may be expanded. Even when the width of the pixel defining layer PDL corresponding to the non-emission area NLA is expanded, the efficiency of the first and third light emitting devices OLED1 and OLED3 may be increased, so that the expansion of the width of the pixel defining layer PDL might not significantly affect the display of an image.

The sensing parts of the input sensing part ISP, which will be described later, may be disposed on the pixel defining layer PDL. Since the width of the pixel defining layer PDL is expanded, the widths of the sensing parts may be expanded. This configuration will be described in detail below.

Figure 11:
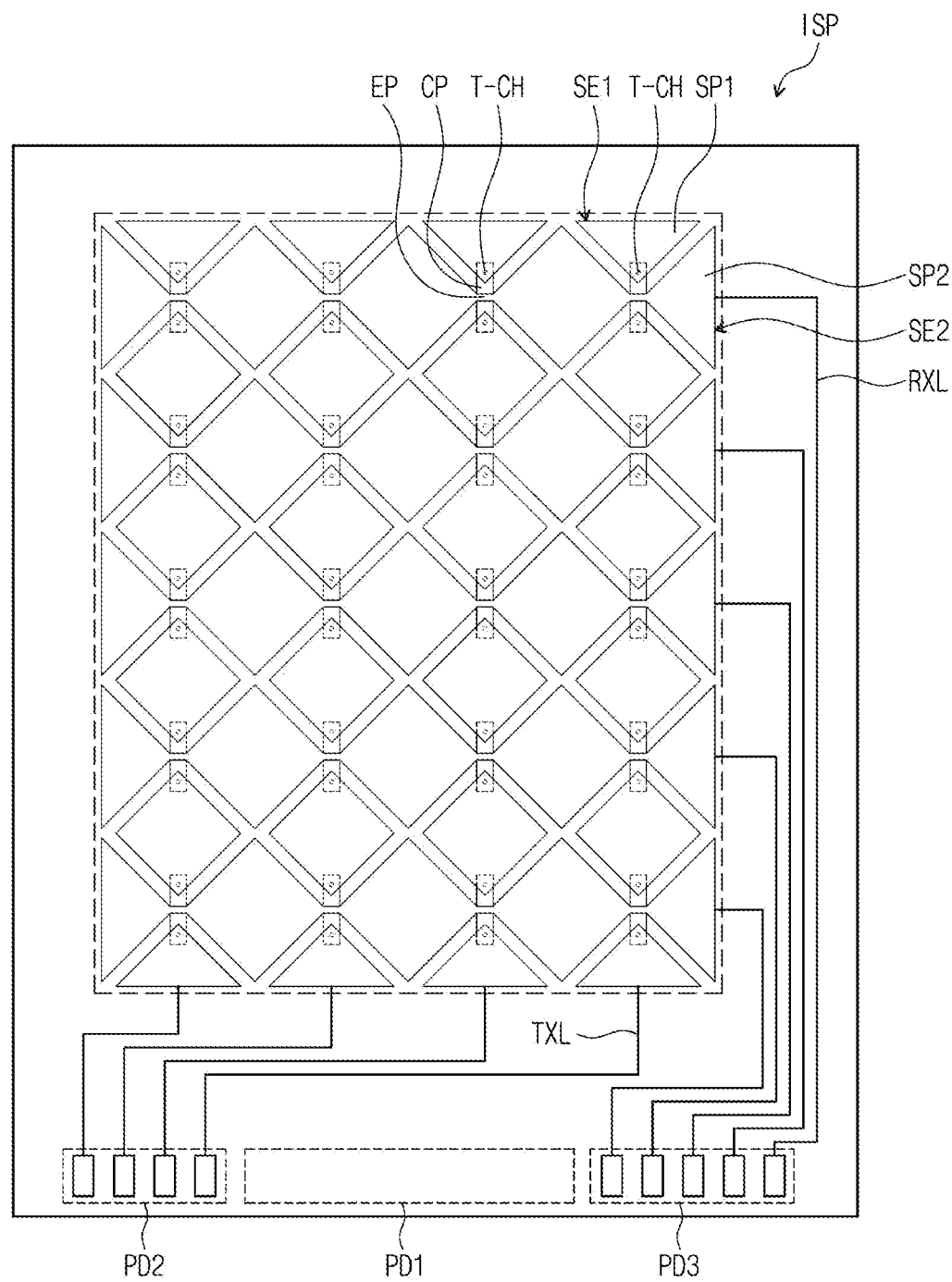
FIG. 11 is a plan view of an input sensing part illustrated in FIG. 2.
Figure 11:
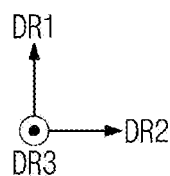

FIG. 11 is a plan view of an input sensing part illustrated in FIG. 2.

Referring to FIG. 11, the input sensing part ISP may include a plurality of sensing electrodes SE1 and SE2, a plurality of wires TXL and RXL, and a plurality of second and third pads PD2 and PD3. The sensing electrodes SE1 and SE2, the wires TXL and RXL, and the second and third pads PD2 and PD3 may be disposed on the thin film encapsulation layer TFE of the display panel DP.

The planar area of the input sensing part ISP may include an active area AA and a non-active area NAA adjacent to the active area AA. The active area AA may overlap the display area DA, and the non-active area NAA may overlap the non-display area NDA.

The sensing electrodes SE1 and SE2 may be disposed in the active area AA, and the second and third pads PD2 and PD3 may be disposed in the non-active area NAA. The second pads PD2 and the third pads PD3 may be adjacent to the lower end of the input sensing part ISP when viewed in a plan view. When viewed in a plan view, the first pads PD1 illustrated in FIG. 5 may be disposed between the second pads PD2 and the third pads PD3.

The wires TXL and RXL may be connected to one ends of the sensing electrodes SE1 and SE2, and may extend to the non-active area NAA to be connected to the second and third pads PD2 and PD3. A touch controller for controlling the input sensing part ISP may be connected to the second and third pads PD2 and PD3 through a printed circuit board.

The sensing electrodes SE1 and SE2 may include the plurality of first sensing electrodes SE1 extending in the first direction DR1 and arranged in the second direction DR2 and the plurality of second sensing electrodes SE2 extending in the second direction DR2 and arranged in the first direction DR1. The second sensing electrodes SE2 may be insulated from and may extend across the first sensing electrodes SEL.

The wires TXL and RXL may include a plurality of first signal wires TXL, which are connected to the first sensing electrodes SE1, and a plurality of second signal wires RXL, which are connected to the second sensing electrodes SE2. The first signal wires TXL may extend to the non-active area NAA and may be connected to the second pads PD2. The second signal wires RXL may extend to the non-active area NAA and may be connected to the third pads PD3.

For example, when viewed in a plan view, the first signal wires TXL may be disposed in the non-active area NAA adjacent to the lower side of the active area AA. For example, when viewed in a plan view, the second signal wires RXL may be disposed in the non-active area NAA adjacent to the right side of the active area AA.

Each of the first sensing electrodes SE1 may include a plurality of first sensing parts SP1 and a plurality of connection patterns CP. The plurality of sensing parts SP1 may be arranged in the first direction DR1, and the plurality of connection patterns CP may connect the first sensing parts SP1 to each other. The connection patterns CP may extend in the first direction DR1 and may be connected to the first sensing parts SP1.

Each of the connection patterns CP may be disposed between two first sensing parts SP1, which are adjacent to each other in the first direction DR1, to connect the two first sensing parts SP1 to each other. For example, an insulating layer (illustrated in FIG. 15 below) is disposed between the connection patterns CP and the first sensing parts SP1, and the connection patterns CP may be connected to the first sensing parts SP1 through contact holes T-CH penetrating in the insulating layer.

Each of the second sensing electrodes SE2 may include a plurality of second sensing parts SP2 and a plurality of extension patterns EP. The plurality of sensing parts SP2 are arranged in the second direction DR2, and the plurality of extension patterns EP may extend from the second sensing parts SP2 in the second direction DR2. When viewed in a plan view, the extension patterns EP may extend to cross the connection patterns CP, respectively.

In each of the second sensing electrodes SE2, the extension patterns EP may be integrally formed with the second sensing parts SP2. Each of the extension patterns EP may be disposed between two second sensing parts SP2 adjacent to each other in the second direction DR2 to extend from the two second sensing parts SP2.

The first sensing parts SP1 and the second sensing parts SP2 may be spaced apart from each other and may be alternately disposed. An electrostatic capacitance may be formed by the first sensing parts SP1 and the second sensing parts SP2.

The first and second sensing parts SP1 and SP2 and the extension patterns EP may be disposed on the same layer. The connection patterns CP may be disposed on a different layer from the first and second sensing parts SP1 and SP2 and the extension patterns EP.

Figure 12:
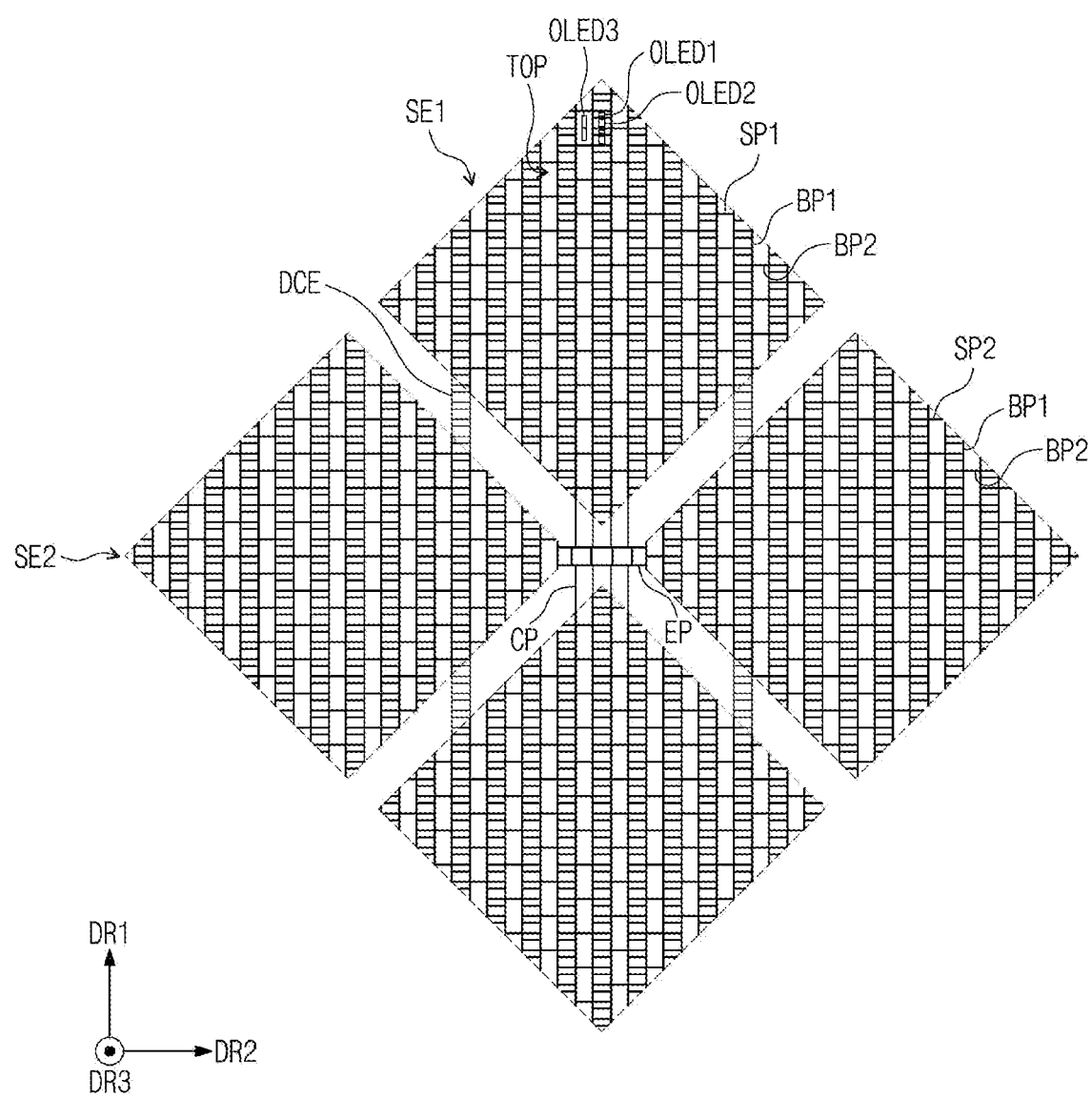
FIG. 12 is a diagram illustrating a detailed configuration of two adjacent first sensing parts and two adjacent second sensing parts illustrated in FIG. 11.

FIG. 12 is a diagram illustrating a detailed configuration of two adjacent first sensing parts and two adjacent second sensing parts illustrated in FIG. 11.

For example, in FIG. 12, six first, second, and third light emitting devices OLED1, OLED2, and OLED3 are illustrated together with the first and second sensing parts SP1 and SP2.

Referring to FIGS. 10A and 12, the first sensing parts SP1 and the second sensing parts SP2 may have a mesh shape. For example, in FIG. 12, edges of the first and second sensing parts SP1 and SP2 are indicated by dotted lines.

The first sensing parts SP1 and the second sensing parts SP2 may include branch portions BP1 and BP2 defining a mesh shape. For example, to have a mesh shape, the first sensing parts SP1 and the second sensing parts SP2 may include a plurality of first branch portions BP1 extending in the first direction DR1 and a plurality of second branch portions BP2 extending in the second direction DR2.

The first branch portions BP1 of each of the first and second sensing parts SP1 and SP2 may cross the second branch portions BP2 of each of the first and second sensing parts SP1 and SP2 and may be integrally formed with each other. Rectangular-shaped openings TOP may be defined by the first branch portions BP1 and the second branch portions BP2.

When viewed in a plan view, the first, second, and third light emitting devices OLED1, OLED2, and OLED3 may be respectively disposed in the openings TOP. For example, six light emitting devices OLED1, OLED2, and OLED3 are illustrated, but the light emitting devices OLED1, OLED2, and OLED3 may be disposed in the openings TOP.

The first and second sensing parts SP1 and SP2 might not overlap the first, second, and third light emitting devices OLED1, OLED2 and OLED3 when viewed in a plan view. When viewed in a plan view, the first and second sensing parts SP1 and SP2 may be disposed between the first, second, and third light emitting devices OLED1, OLED2, and OLED3 and may extend in the first direction DR1 and the second direction DR2.

When viewed in a plan view, the first and second branch portions BP1 and BP2 described above are disposed between the first, second, and third light emitting devices OLED1, OLED2, and OLED3 and may extend in the first and second directions DR1 and DR2. When viewed in a plan view, the first and second branch portions BP1 and BP2 might not overlap the first, second, and third light emitting devices OLED1, OLED2, and OLED3. For example, in FIG. 12, the first and second branch portions BP1 and BP2 of the first and second sensing parts SP1 and SP2 are illustrated with thick lines.

According to the above structure, the first and second sensing parts SP1 and SP2 may be disposed on the non-emission area NLA. The first and second sensing parts SP1 and SP2 may be disposed on the non-emission area NLA. Since the pixel defining layer PDL is disposed in the non-emission area NLA, when viewed in a plan view, the first and second sensing parts SP1 and SP2 may overlap the pixel defining layer PDL.

When viewed in a plan view, the first and second branch portions BP1 and BP2 do not overlap the emission area LA but overlap the non-emission area NLA and may extend in the first direction DR1 and the second direction DR2. Since the first and second sensing parts SP1 and SP2 are disposed in the non-emission area NLA, light generated by the light emitting devices OLED1, OLED2, and OLED3 may be emitted normally without being affected by the first and second sensing parts SP1 and SP2.

The connection pattern CP may be disposed below the first and second sensing parts SP1 and SP2, may extend in the first direction DR1, and may connect the first sensing parts SP1 to each other. The connection pattern CP is connected to the first sensing parts SP1 by the above-described contact holes T-CH, and this configuration will be described in detail with reference to FIGS. 14A and 15. For example, the connection pattern CP disposed below the first and second sensing parts SP1 and SP2 may be illustrated as a thin line.

Figure 13:
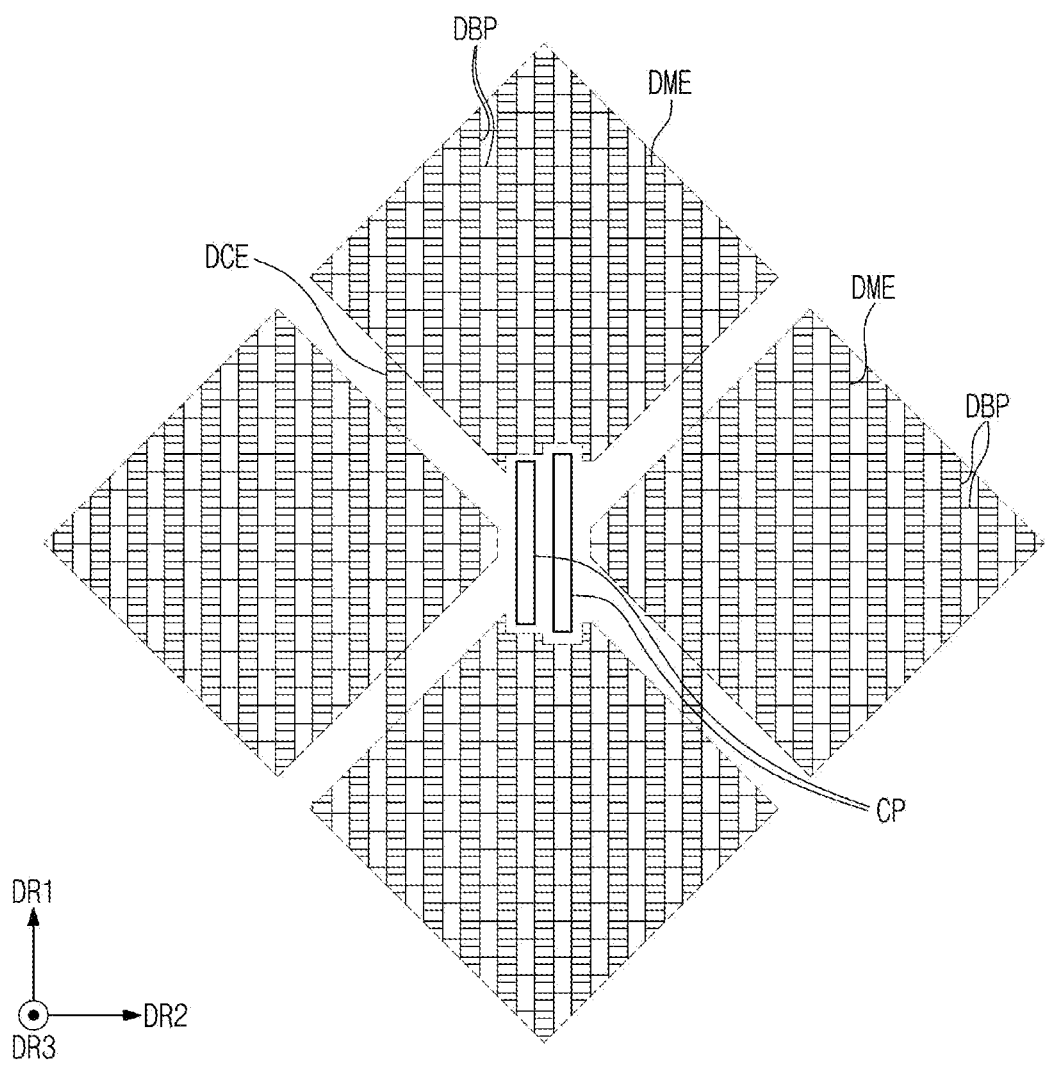
FIG. 13 is a diagram illustrating dummy electrodes and a connection pattern disposed under first and second sensing parts illustrated in FIG. 12.

A planar configuration of the connection pattern CP will be illustrated in FIG. 13. In addition, dummy connection electrodes DCE illustrated with thin lines in FIG. 12 will be described with reference to FIG. 13.

The extension pattern EP may be disposed between the first sensing parts SP1 and may extend from the second sensing parts SP2. The extension pattern EP may have the same mesh shape as the first and second sensing parts SP1 and SP2. The extension pattern EP may include branch portions extending in the first and second directions DR1 and DR2 and may be integrally formed with the second sensing parts SP2.

The extension pattern EP, the first sensing parts SP1, and the second sensing parts SP2 may be disposed on the same layer and may be simultaneously patterned with the same material to be formed. For example, in FIG. 12, the extension pattern EP is illustrated by a relatively thick line. In an embodiment of the present invention, the extension pattern EP, the first sensing parts SP1, and the second sensing parts SP2 may be a sensing part.

FIG. 13 is a diagram illustrating dummy electrodes and a connection pattern disposed under first and second sensing parts illustrated in FIG. 12.

Referring to FIGS. 12 and 13, the connection pattern CP may have a rectangular closed loop shape extending longer in the first direction DR1. As illustrated in FIG. 13, the plurality of connection patterns CP may be provided, but the present invention is not limited thereto, and the single connection pattern CP may be provided. In FIG. 13, two connection patterns CP are illustrated, but hereinafter, the connection pattern CP will be described as one.

The connection pattern CP disposed under the first sensing parts SP1 may overlap the first and second branch portions BP1 and BP2 when viewed in a plan view. A width of a line defining a closed loop of the connection pattern CP may be lesser than that of the first and second branch portions BP1 and BP2. For example, the connection pattern CP may have a width lesser than that of the first and second sensing parts SP1 and SP2 and the extension pattern EP. Accordingly, the connection pattern CP disposed under the first sensing parts SP1 may be covered by the first and second branch portions BP1 and BP2 and might not be perceived to the outside. This configuration will hereinafter be illustrated as a more enlarged and detailed configuration with reference to FIG. 14A.

The input sensing part ISP may further include a plurality of dummy electrodes DME. The dummy electrodes DME may be disposed on the same layer as the connection pattern CP. The dummy electrodes DME and the connection pattern CP may be disposed below the first and second sensing parts SP1 and SP2 and the extension pattern EP.

For example, the connection pattern CP and the dummy electrodes DME are illustrated with thinner lines than that of each of the first and second sensing parts SP1 and SP2 illustrated in FIG. 12. In addition, edges of the dummy electrodes DME are illustrated with dotted lines.

The dummy electrodes DME may be spaced apart from the connection pattern CP. The dummy electrodes DME might not be connected to the connection pattern CP and may be insulated from the connection pattern CP. The dummy electrodes DME and the connection pattern CP may be formed by being simultaneously patterned with the same material.

The dummy electrodes DME may have the same shape as that of each of the first and second sensing parts SP1 and SP2. For example, the dummy electrodes DME may include dummy branch portions DBP extending in the first and second directions DR1 and DR2 to have a mesh shape.

When viewed in a plan view, the dummy branch portions DBP may overlap the first and second branch portions BP1 and BP2. The dummy branch portions DBP may have a width lesser than that of each of the first and second branch portions BP1 and BP2. For example, the dummy electrodes DME may have a width lesser than that of each of the first and second sensing parts SP1 and SP2 and the extension pattern EP. Accordingly, the dummy branch portions DBP disposed under the first and second sensing parts SP1 and SP2 may be covered by the first and second branch portions BP1 and BP2 and thus might not be perceived to the outside. This configuration will hereinafter be illustrated as a more enlarged and detailed configuration with reference to FIG. 14A.

The dummy electrodes DME may be connected to each other. For example, the dummy electrodes DME may be connected to each other by the dummy connection electrodes DCE. The dummy connection electrodes DCE may be integrally formed with the dummy electrodes DME. For example, the dummy connection electrodes DCE are disposed between the dummy electrodes DME adjacent to each other in a first diagonal direction DDR1 or a second diagonal direction DDR2, and the dummy connection electrodes DCE may extend from the dummy electrodes DME that are adjacent to each other.

The first diagonal direction DDR1 may be a direction crossing first and second directions DR1 and DR2 on a plane defined by the first and second directions DR1 and DR2. The second diagonal direction DDR2 may be a direction crossing the first diagonal direction DDR1 on a plane defined by the first and second directions DR1 and DR2.

Figure 14A:
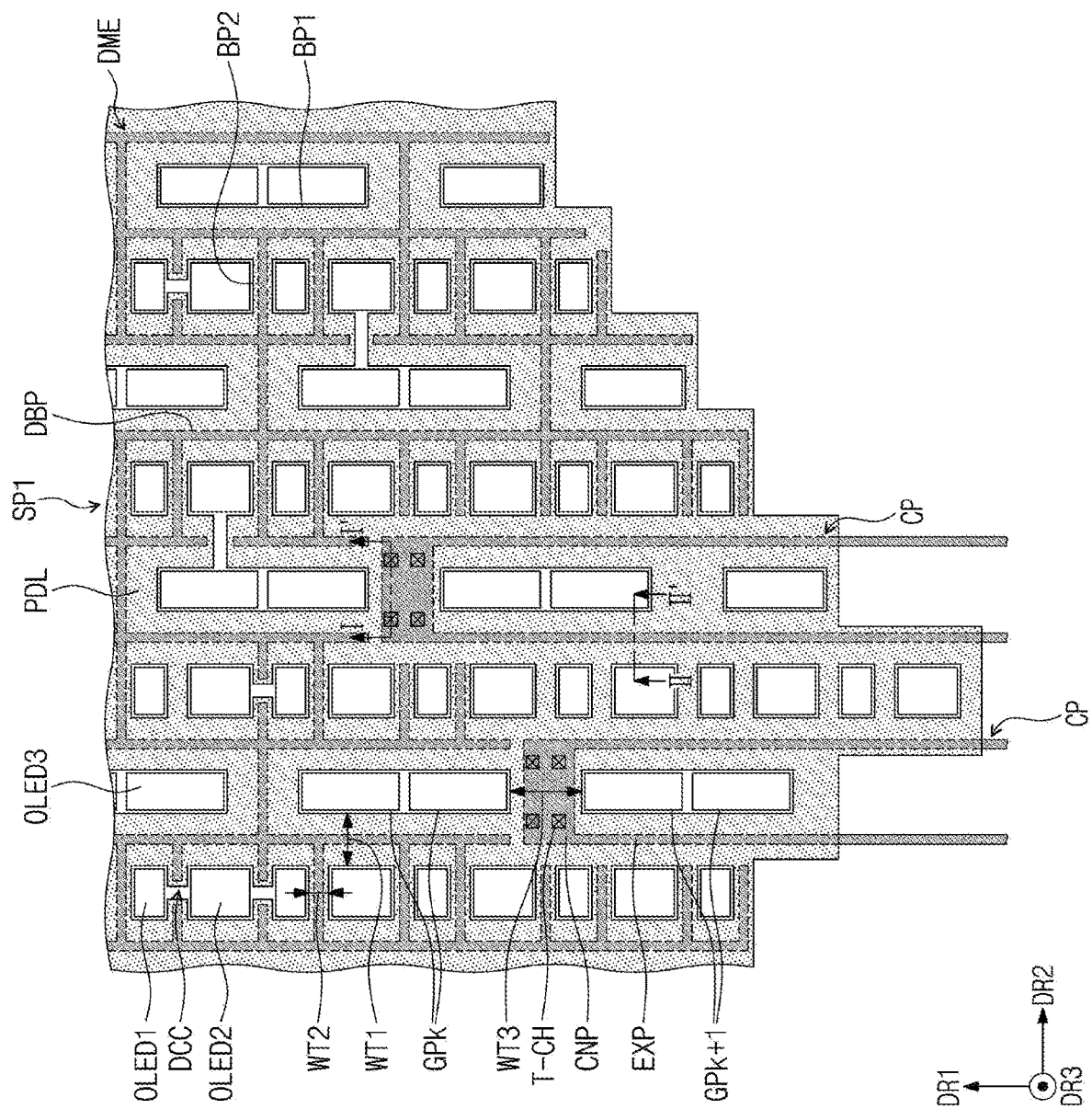
FIG. 14A is an enlarged view of components overlapping a first sensing part illustrated above among first sensing parts illustrated in FIG. 13.

FIG. 14A is an enlarged view of components overlapping a first sensing part illustrated above among first sensing parts illustrated in FIG. 13.

For example, in FIG. 14A, a portion adjacent to a lower edge of the first sensing part SP1 is illustrated, and the light emitting devices OLED1, OLED2, and OLED3, the dummy electrodes DME, and the connection pattern CP, which overlap the first sensing part SP1 are illustrated.

Referring to FIGS. 10A, 12, 13, and 14A, the first and second branch portions BP1 and BP2 may extend in the first and second directions DR1 and DR2 between the first, second, and third light emitting devices OLED1, OLED2, and OLED3. However, the second branch portions BP2 extending in the second direction DR2 might not extend between the third light emitting devices OLED3 of each of the groups GP. For example, edges of the first and second branch portions BP1 and BP2 are illustrated in solid lines, and insides of the first and second branch portions BP1 and BP2 are illustrated in gray.

When viewed in a plan view, the width of the first branch portion BP1 disposed between the pair of first and second light emitting devices OLED1 and OLED2 and the third light emitting device OLED3 in the second direction DR2 may be a first width WT1. For example, the width of the first branch portion BP1 disposed between the first light emitting device OLED1 and the third light emitting device OLED3, which are adjacent to each other in the second direction DR2, is the first width WT1. In addition, the width of the first branch portion BP1 disposed between the second light emitting device OLED2 and the third light emitting device OLED3, which are adjacent to each other in the second direction DR2, is the first width WT1.

When viewed in a plan view, the width of the second branch portion BP2 disposed between the pair of first and second light emitting devices OLED1 and OLED2, which are adjacent to each other in the first direction DR1, may be a second width WT2. The first width WT1 may be greater than the second width WT2. As described above, the first and second sensing parts SP1 and SP2 may be sensing parts. Accordingly, the first width WT1 of the sensing part disposed between the pair of the first and second light emitting devices OLED1 and OLED2 and the third light emitting device OLED3, which is adjacent to the of the first and second light emitting devices OLED1 and OLED2, is greater than the second width WT2 of the sensing part between the first and second light emitting devices OLED1 and OLED2, which are adjacent to each other.

When viewed in a plan view, a width in the first direction DR1 of the second branch portion BP2 disposed between the third light emitting device OLED3 of a k-th group GPk and the third light emitting device OLED3 of a (k+1)-th group GPk+1 facing each other in the first direction DR1 may be a third width WT3. The 'k' is a natural number. The third width WT3 may be greater than the first width WT1.

The connection pattern CP may be disposed under the first sensing part SP1. When viewed in a plan view, the connection pattern CP may overlap a portion of the first sensing part SP1 adjacent to a lower side of the first sensing part SP1. When viewed in a plan view, the dummy electrode DME may be spaced apart from the connection pattern CP and might not overlap the connection pattern CP. When viewed in a plan view, the dummy branch portions DBP of the dummy electrode DME may extend in the first and second directions DR1 and DR2 to overlap the first and second branch portions BP1 and BP2.

For example, edges of the dummy electrode DME and the connection pattern CP overlapping the first and second branch portions BP1 and BP2 are illustrated with dotted lines. In addition, insides of the dummy electrode DME and the connection pattern CP is illustrated in a darker gray color than the first and second branch portions BP1 and BP2.

A width of the dummy branch portions DBP may be lesser than a width of the first and second branch portions BP1 and BP2. For example, the width of the dummy electrode DME may be lesser than the width of the first sensing part SP1. The dummy branch portions DBP are disposed under the first and second branch portions BP1 and BP2 and are covered by the first and second branch portions BP1 and BP2, so that the dummy branch portions DBP might not be perceived to the outside.

Hereinafter, the configuration of the left connection pattern CP among the two connection patterns CP illustrated in FIG. 14A will be mainly described.

The connection pattern CP disposed under the first sensing part SP1 overlaps the first and second branch portions BP1 and BP2 in a plan view, and may have a width lesser than that of the first and second branch portions BP1 and BP2. For example, the width of the connection pattern CP may be less than the width of the first sensing part SP1. Accordingly, the connection pattern CP disposed under the first sensing parts SP1 may be covered by the first and second branch portions BP1 and BP2 and thus might not be perceived to the outside.

The connection pattern CP may be connected to the first sensing part SP1 between the k-th group GPk and the (k+1)-th group GPk+1 among the groups GP that are disposed under the first sensing part SP1. The connection pattern CP may be disposed between the k-th group GPk and the (k+1)-th group GPk+1 to be connected to the second branch portion BP2 having the third width WT3. Since the connection pattern CP is connected to the second branch portion BP2 of the first sensing part SP1 having a larger area, the connection pattern CP may be easily connected to the first sensing part SP1.

For example, the connection pattern CP may be connected to the second branch portion BP2 disposed between the two groups GP adjacent to the lower side of the first sensing part SP1. Even in the first sensing part SP1 disposed further below in FIG. 12, the connection pattern CP may be connected to the second branch portion BP2 disposed between two adjacent groups GP.

The connection pattern CP may include a connection portion CNP and an extension portions EXP. The connection portion CNP is connected to the first sensing part SP1, and the extension portions EXP extend from both ends of the connection portion CNP. The connection portion CNP may extend in the second direction DR2 between the k-th group GPk and the (k+1)-th group GPk+1. The extension portions EXP may extend in the first direction DR1 from both ends of the connection portion CNP that are opposite to each other in the second direction DR2.

The extension portions EXP may extend in the first direction DR1 between the first and second light emitting devices OLED1 and OLED2 adjacent to the k-th and (k+1)-th groups GPk and GPk+1 and the k-th and (k+1)-th groups GPk and GPk+1 when viewed in a plan view.

The connection portion CNP may be connected to the second branch portion BP2 disposed between the k-th group GPk and the (k+1)-th group GPk+1 through the plurality of contact holes T-CH. The connection portion CNP is also disposed on the first sensing part SP1 disposed further below in FIG. 12, and may be connected to the first sensing part SP1 disposed further below at a position corresponding to FIG. 14A. For example, although four contact holes T-CH are illustrated, the number of contact holes T-CH is not limited thereto.

The connection portion CNP may have a width less than a width of the second branch portion BP2. The extension portions EXP may have a width less than a width of the first branch portions BP1. Accordingly, when viewed in a plan view, the connection portion CNP and the extension portions EXP that overlap the first and second branch portions BP1 and BP2 might not be perceived to the outside by the first and second branch portions BP1 and BP2.

The connection pattern CP may be disposed adjacent to two to four third light emitting devices OLED3 adjacent to the lower side of the first sensing part SP1. For example, the connection pattern CP disposed on the left side may be adjacent to the two third light emitting devices OLED3 of the (k+1)-th group GPk+1. The connection pattern CP disposed in the right side may be adjacent to the three third light emitting devices OLED3 in a structure, since the third light emitting device OLED3 that does not belong to the groups GP and is disposed individually exists.

Each of the first and second branch portions BP1 and BP2 may have a width of about 4.3 micrometers (µm) to about 10.6 micrometers (µm). The widths of the first and second branch portions BP1 and BP2 may be a value measured in a direction crossing the extending direction of each of the first and second branch portions BP1 and BP2. For example, the width of the first branch portions BP1 may be a value measured in the second direction DR2. The width of the second branch portions BP2 may be a value measured in the first direction DR1.

The width of the extension portions EXP in the second direction DR2 may be greater than or equal to about 4.0 micrometers (µm), and may be less than the width of each of the first and second branch portions BP1 and BP2.

In an embodiment of the present invention, some of the first and second branch portions BP1 and BP2 among the first and second branch portions BP1 and BP2 may be formed in a cut off state. The broken portions are marked with a reference mark DCC. When some of the first and second branch portions BP1 and BP2 are cut off, an aperture ratio may be increased to increase light transmittance.

In an embodiment of the present invention, since each of the connection patterns CP and the dummy electrodes DME have a width less than a width of each of the first and second sensing parts SP1 and SP2 and are disposed on a lower layer, they might not be perceived to the outside by the first and second sensing parts SP1 and SP2.

Figure 14B:
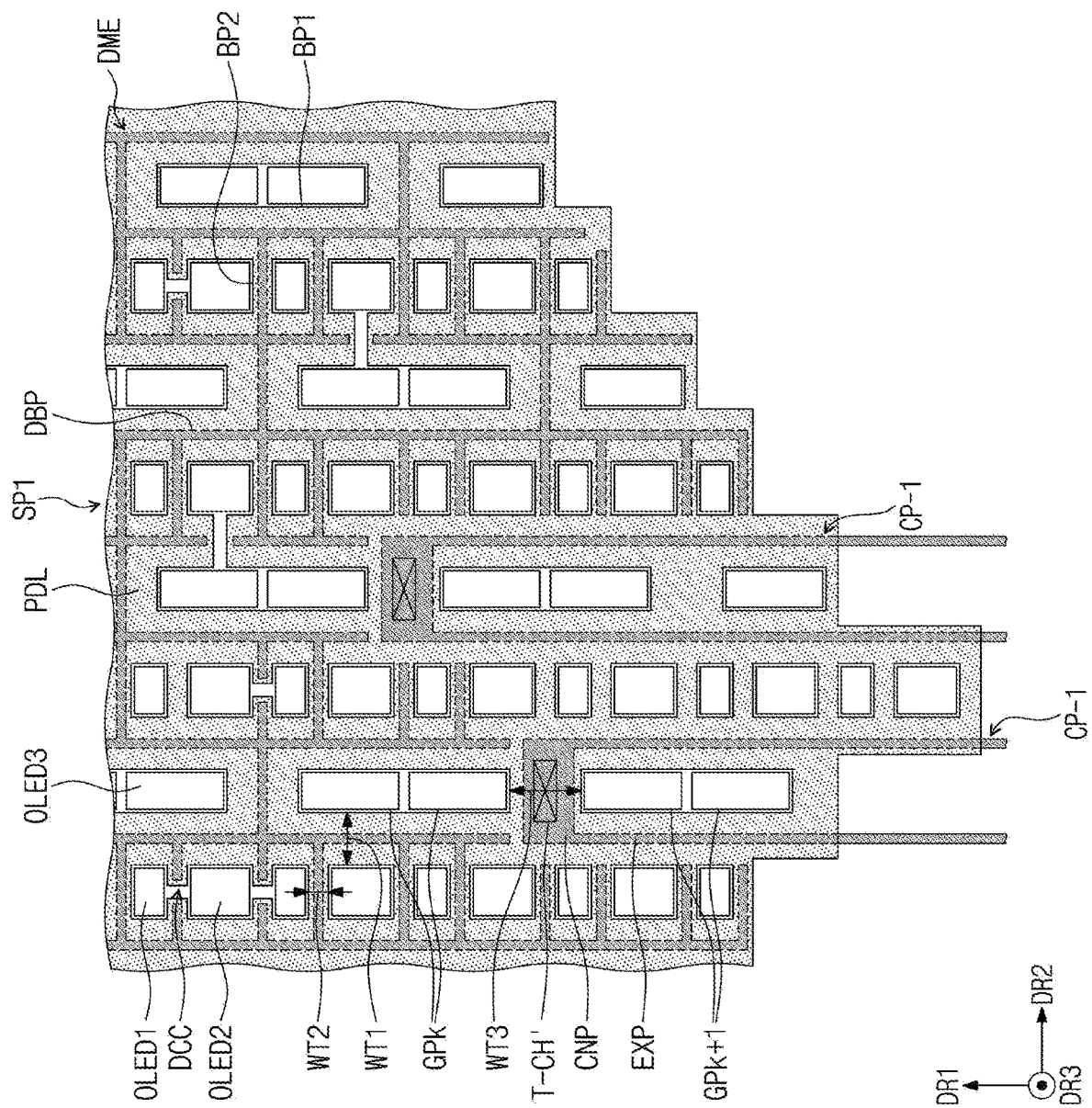
FIG. 14B is a diagram illustrating a configuration of a connection pattern, according to an embodiment of the present invention.

FIG. 14B is a diagram illustrating a configuration of a connection pattern, according to an embodiment of the present invention.

For example, FIG. 14B is a plan view corresponding to FIG. 14A. Hereinafter, a configuration of a connection pattern CP-1 illustrated in FIG. 14B will be described mainly with a configuration different from the configuration illustrated in FIG. 14A.

Referring to FIG. 14B, the shape of the connection pattern CP-1 may be the same as that of the connection pattern CP illustrated in FIG. 14A. However, the connection pattern CP-1 may be connected to the second branch portion BP2 disposed between the k-th group GPk and the (k+1)-th group GPk+1 through one contact hole T-CH'. For example, the connection portion CNP of the connection pattern CP-1 may be connected to the second branch portion BP2 through the one contact hole T-CH'.

FIG. 14C is a diagram illustrating a configuration of a connection pattern, according to an embodiment of the present invention.

FIG. 14C illustrates a portion of a connection pattern CP-2 disposed under any one first sensing part SP1 as an example.

Referring to FIG. 14C, the first and second light emitting devices OLED1 and OLED2 may be alternately disposed in the same column. The third light emitting devices OLED3 may be disposed in the same column as one another at certain intervals in the first direction DR1. Unlike FIG. 14A, the third light emitting devices OLED3 might not be disposed to be staggered with respect to each other.

The first sensing part SP1 may be disposed between the first, second, and third light emitting devices OLED1, OLED2, and OLED3. The first and second branch portions BP1 and BP2 may extend past between the first, second, and third light emitting devices OLED1, OLED2, and OLED3. Some of the first and second branch portions BP1 and BP2 among the first and second branch portions BP1 and BP2 may be formed in a cut off state.

The connection pattern CP-2 may have a width less than a width of each of the first and second branch portions BP1 and BP2. The connection pattern CP-2 may be connected to the first sensing part SP1 through the plurality of contact holes T-CH. The connection pattern CP-2 may extend in the first direction DR1 and may be connected to another first sensing part adjacent to the first sensing part SP1 illustrated in FIG. 14C.

The connection pattern CP-2 may include first extension portions EXP1 extending parallel to each other in the first direction DR1, second extension portions EXP2 extending parallel to each other in the second direction DR2, and a plurality of protrusions PRT protruding from the first extension portions EXP1 in the second direction DR2.

The first extension portions EXP1 may extend between pairs of the first and second light emitting devices OLED1 and OLED2 and the third light emitting devices OLED3, which are disposed adjacent to each other and arranged in adjacent columns. The second extension portions EXP2 may extend from the first extension portions EXP1. The second extension portions EXP2 may extend between the first and second light emitting devices OLED1 and OLED2 and between the third light emitting devices OLED3, which are arranged in rows adjacent to each other. The protrusions PRT may extend toward each other from the first extension portions EXP1.

When viewed in a plan view, the first and second extension portions EXP1 and EXP2 and the protrusions PRT overlap the first and second branch portions BP1 and BP2, and may each have a width less than those of the first and second branch portions BP1 and BP2. Accordingly, when viewed in a plan view, the first and second extension portions EXP1 and EXP2 and the protrusions PRT might not be perceived to the outside since they are covered by the first and second branch portions BP1 and BP2.

The second extension portions EXP2 may be connected to the second branch portions BP2 through the contact holes T-CH. For example, six contact holes T-CH are illustrated in each of the second extension portions EXP2, but the number of contact holes T-CH is not limited thereto.

Figure 15:
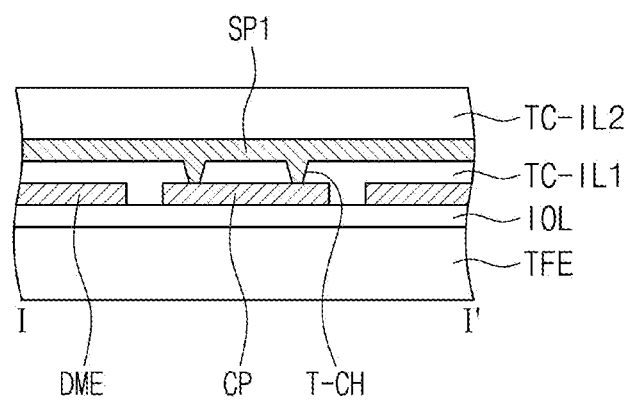
FIG. 15 is a cross-sectional view taken along line I-I' illustrated in FIG. 14A.

FIG. 15 is a cross-sectional view taken along line I-I' illustrated in FIG. 14A.

Referring to FIG. 15, an insulating layer IOL may be disposed on the thin film encapsulation layer TFE. The insulating layer IOL may include an inorganic insulating layer. The connection pattern CP may be disposed on the insulating layer IOL. The dummy electrode DME may be disposed around the connection pattern CP. A first insulating layer TC-IL1 may be disposed on the insulating layer IOL. The first insulating layer TC-IL1 may be disposed on the insulating layer IOL to cover the connection pattern CP and the dummy electrode DME. The first insulating layer TC-IL1 may include an inorganic insulating layer or an organic insulating layer.

The first sensing part SP1 may be disposed on the first insulating layer TC-IL1. The second sensing part SP2 and the extension pattern EP disposed on the same layer as the first sensing part SP1 may also be disposed on the first insulating layer TC-IL1. The connection pattern CP may be connected to the first sensing part SP1 through the plurality of contact holes T-CH provided in the first insulating layer TC-IL1. The connection pattern CP may be connected to the first sensing part SP1 disposed further below in FIG. 12 in the same manner.

A second insulating layer TC-IL2 may be disposed on the first sensing part SP. The second insulating layer TC-IL2 may be disposed on the first insulating layer TC-IL1 to cover the first sensing part SP1. The second insulating layer TC-IL2 may include an organic insulating layer.

Figure 16A:
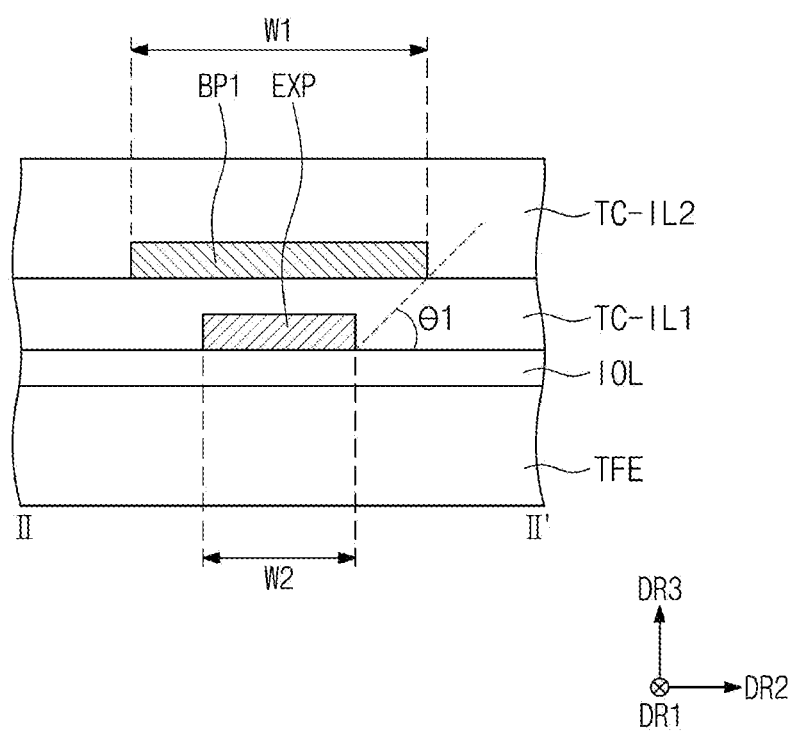
FIG. 16A is a cross-sectional view taken along line II-II' illustrated in FIG. 14A.

FIG. 16A is a cross-sectional view taken along line II-II' illustrated in FIG. 14A.

Referring to FIG. 16A, the extension portion EXP may be disposed on the insulating layer IOL, and the first branch portion BP1 that is disposed on the extension portion EXP may be disposed on the first insulating layer TC-IL1. An angle θ1 formed by a line (illustrated by a dotted line) connecting the lower end of one side of the extension portion EXP to the lower end of one side of the first branch portion BP1 based on the second direction DR2 may be about 45 degrees.

The first branch portion BP1 may have a width W1 of about 4.3 micrometers (μm) to about 10.6 micrometers (μm) in the second direction DR2. The extension portion EXP may have a width of about 4.0 micrometers (μm) in the second direction DR2. The dummy electrodes DME may also have a width of about 4.0 micrometers (μm) like the extension portion EXP.

Figure 16B:
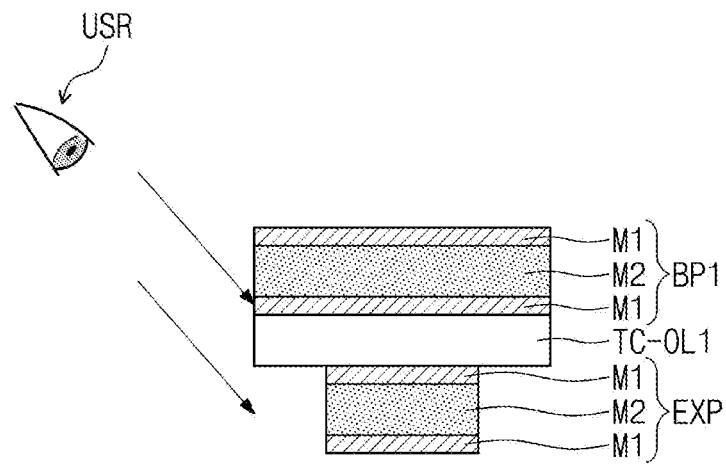
FIG. 16B is an enlarged cross-sectional view of an extension portion and a first branch portion illustrated in FIG. 16A.
Figure 16C:
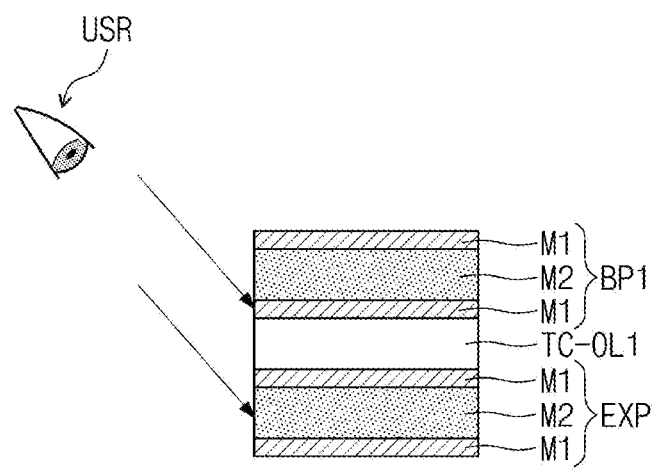
FIG. 16C is a diagram illustrating a configuration in which an extension portion and a first branch portion illustrated in FIG. 16A have the same width.

FIG. 16B is an enlarged cross-sectional view of an extension portion and a first branch portion illustrated in FIG. 16A. FIG. 16C is a diagram illustrating a configuration in which an extension portion and a first branch portion illustrated in FIG. 16A have the same width as each other.

For example, a portion of the first insulating layer TC-IL1 overlapping the first branch portion BP1 is illustrated. The arrows in FIGS. 16B and 16C indicate a viewing angle of a user USR.

Referring to FIG. 16B, each of the extension portion EXP and the first branch portion BP1 may include first metal layers M1 and a second metal layer M2 disposed between the first metal layers M1. For example, the first metal layers M1 may include titanium (Ti), and the second metal layer M2 may include copper (Cu).

When the user USR views the extension portion EXP and the first branch portion BP1 from the side, the extension portion EXP has a width less than a width of the first branch portion BP1, so that the extension portion EXP might not be perceived by the user USR.

Referring to FIG. 16C, the extension portion EXP may have the same width as that of the first branch portion BP1. In this case, when the user USR views the extension portion EXP and the first branch portion BP1 from the side, the extension portion EXP disposed under the first branch portion BP1 may be perceived by the user USR.

Figure 17:
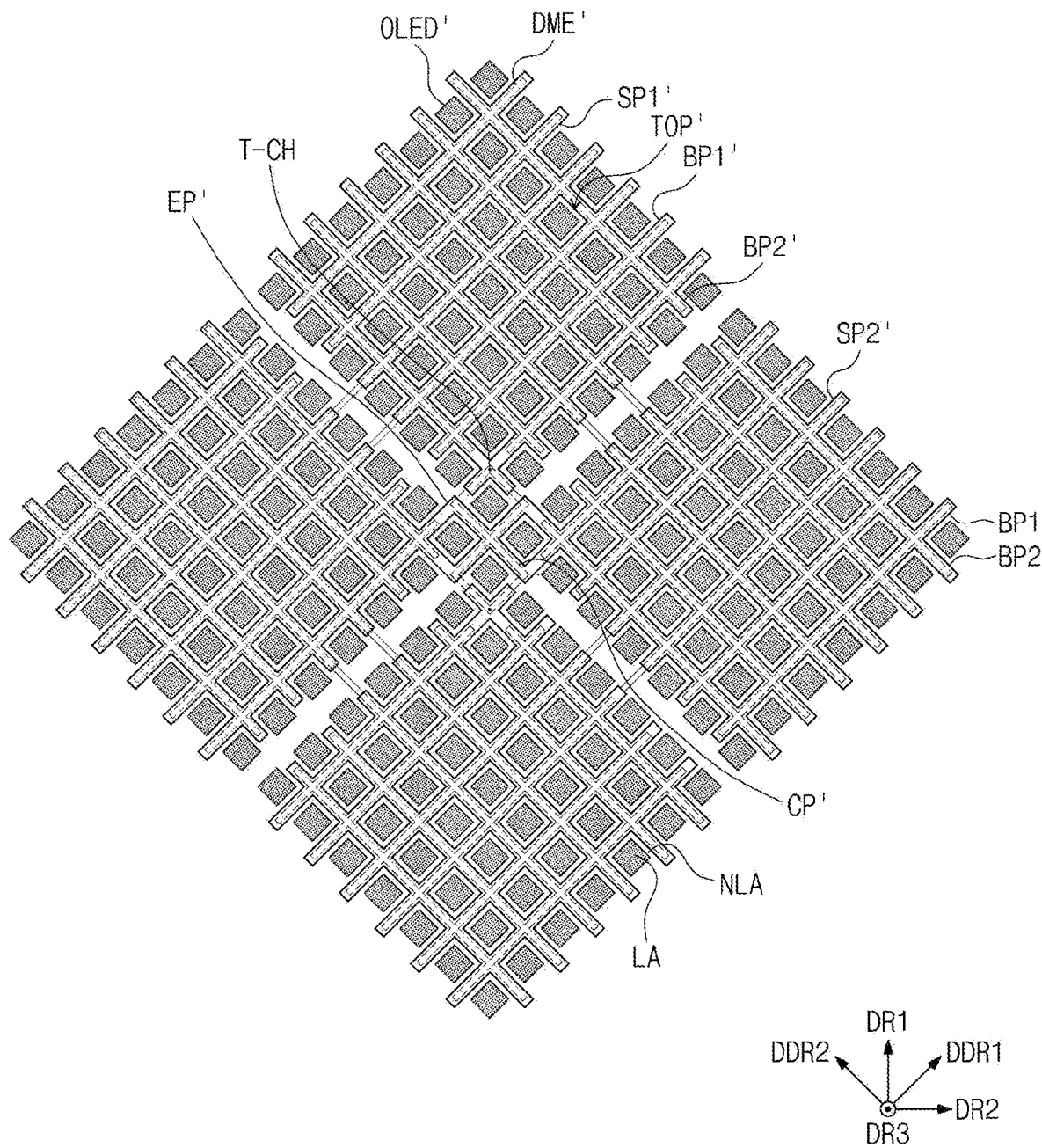
FIG. 17 is a diagram illustrating a plane configuration of light emitting devices and first and second sensing parts, according to an embodiment of the present invention.

FIG. 17 is a diagram illustrating a plane configuration of light emitting devices and first and second sensing parts, according to an embodiment of the present invention.

Hereinafter, the configuration of light emitting devices OLED' and first and second sensing parts SP1' and SP2' illustrated in FIG. 17 will be mainly described with reference to a configuration different from that of FIG. 12. For example, in FIG. 17, two first sensing parts SP1' adjacent to each other in the first direction DR1 and two second sensing parts SP2' adjacent to each other in the second direction DR2 are illustrated.

Referring to FIG. 17, the first and second sensing parts SP1 and SP2 illustrated in FIG. 11 may be formed into the first and second sensing parts SP1' and SP2' illustrated in FIG. 17. The first and second sensing parts SP' and SP2' may have a mesh shape. Each of the first and second sensing parts SP1' and SP2' may include a plurality of first branch portions BP1' extending in the first diagonal direction DDR1 and a plurality of second branch portions BP2' extending in the second diagonal direction DDR2, to have a mesh shape.

The first branch portions BP1' of each of the first and second sensing parts SP1' and SP2' may cross the second branch portions BP2' of each of the first and second sensing parts SP1' and SP2' and may be integrally formed with each other. Rhombus-shaped touch openings TOP may be defined by the first branch portions BP1' and the second branch portions BP2'. The first and second branch portions BP1' and BP2' may be disposed on the non-emission area NLA.

The light emitting devices OLED' may be respectively disposed in the touch openings TOP. The light emitting devices OLED' may have the same configuration as the above-described light emitting devices OLED1, OLED2, and OLED3 except for a different shape on a plane.

A connection pattern CP' may be disposed between the first sensing parts SP1' to connect the first sensing parts SP1' to each other. The connection pattern CP' may have a mesh shape. The connection pattern CP' may be connected to the first sensing parts SP1' through the contact holes T-CH. The lines of the connection pattern CP' may have a width less than a width of each of the first and second branch portions BP1' and BP2' of the first sensing parts SP1'.

An extension pattern EP' may be disposed between the first sensing parts SPP' and may extend from the second sensing parts SP2'. The second sensing parts SP2' and the extension pattern EP' may be integrally formed with each other. The extension pattern EP' may have a mesh shape.

For example, the first sensing parts SP1', the second sensing parts SP2', and the extension pattern EP' are illustrated by a solid line, and the connection pattern CP' is illustrated by a dotted line.

Dummy electrodes DME' have the same shape as the first and second sensing parts SP1' and SP2' and are disposed under the first and second sensing parts SP' and SP2' to overlap the first and second sensing parts SP' and SP2'. For example, the dummy electrodes DME' that are disposed under the first and second sensing parts SP1' and SP2' are indicated by dotted lines. The dummy electrodes DME' may be connected to each other. Branch portions of the dummy electrodes DME' may each have a width less than that of each of the first and second branch portions BP1' and BP2'.

Figure 18:
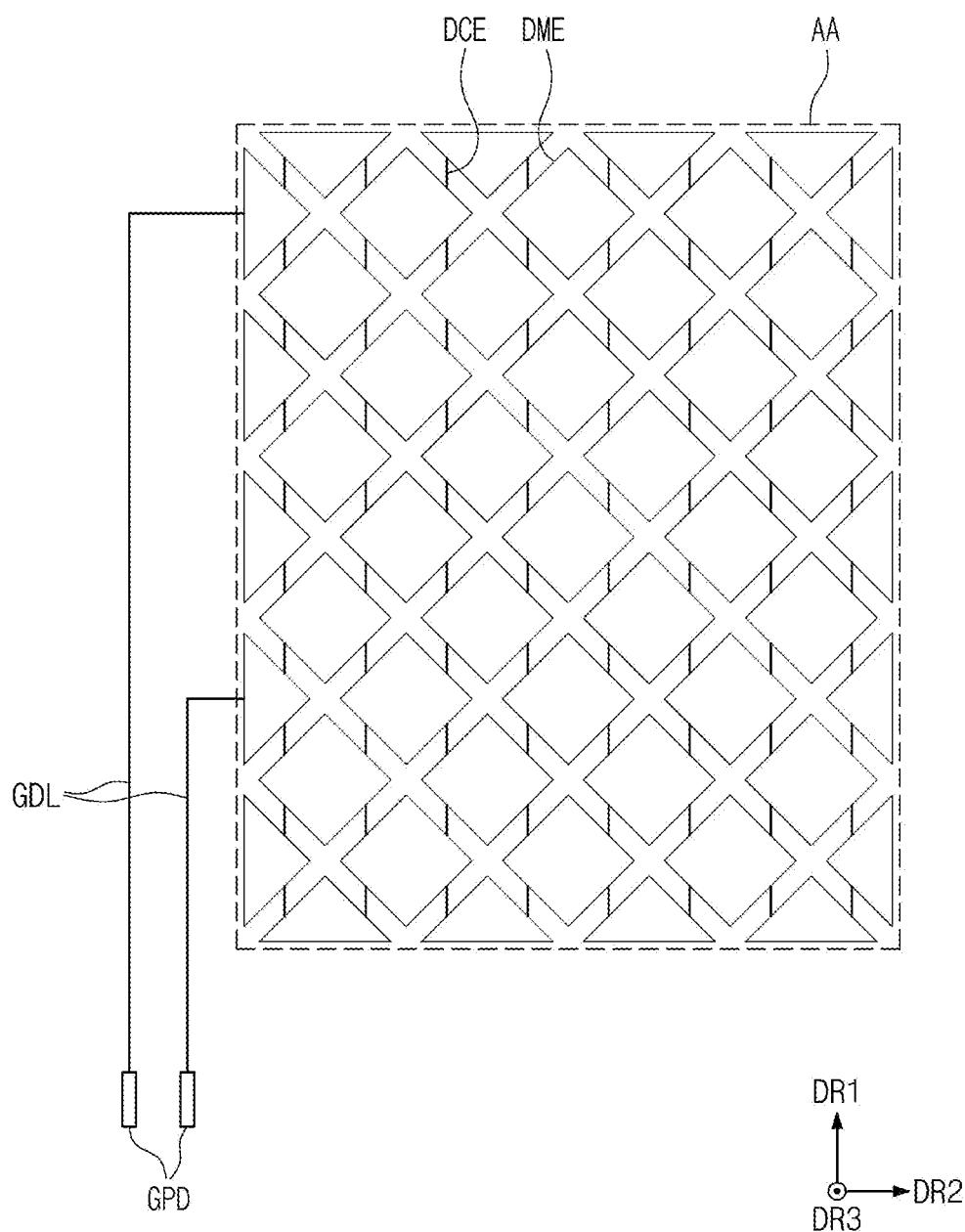
FIG. 18 is a diagram illustrating a state in which dummy electrodes illustrated in FIG. 13 are disposed in an active region illustrated in FIG. 11.

FIG. 18 is a diagram illustrating a state in which dummy electrodes illustrated in FIG. 13 are disposed in an active region illustrated in FIG. 11.

For example, in FIG. 18, the dummy connection electrodes DCE are illustrated with a single line.

Referring to FIG. 18, the dummy electrodes DME may be connected to each other by the dummy connection electrodes DCE. The dummy electrodes DME may be integrally formed with the dummy connection electrodes DCE; however, the present inventive concept is not limited thereto.

Ground wires GDL may be connected to some of the dummy electrodes DME among the dummy electrodes DME. The ground wires GDL may be connected to ground pads GPD. The dummy electrodes DME may receive a ground voltage through the ground pads GPD and the ground wires GDL. However, the present invention is not limited thereto, and a second voltage having a level lower than that of the first voltage may be applied to the dummy electrodes DME. The ground voltage and the second voltage are DC voltages and may have the same level as each other or different levels from each other.

Figure 19:
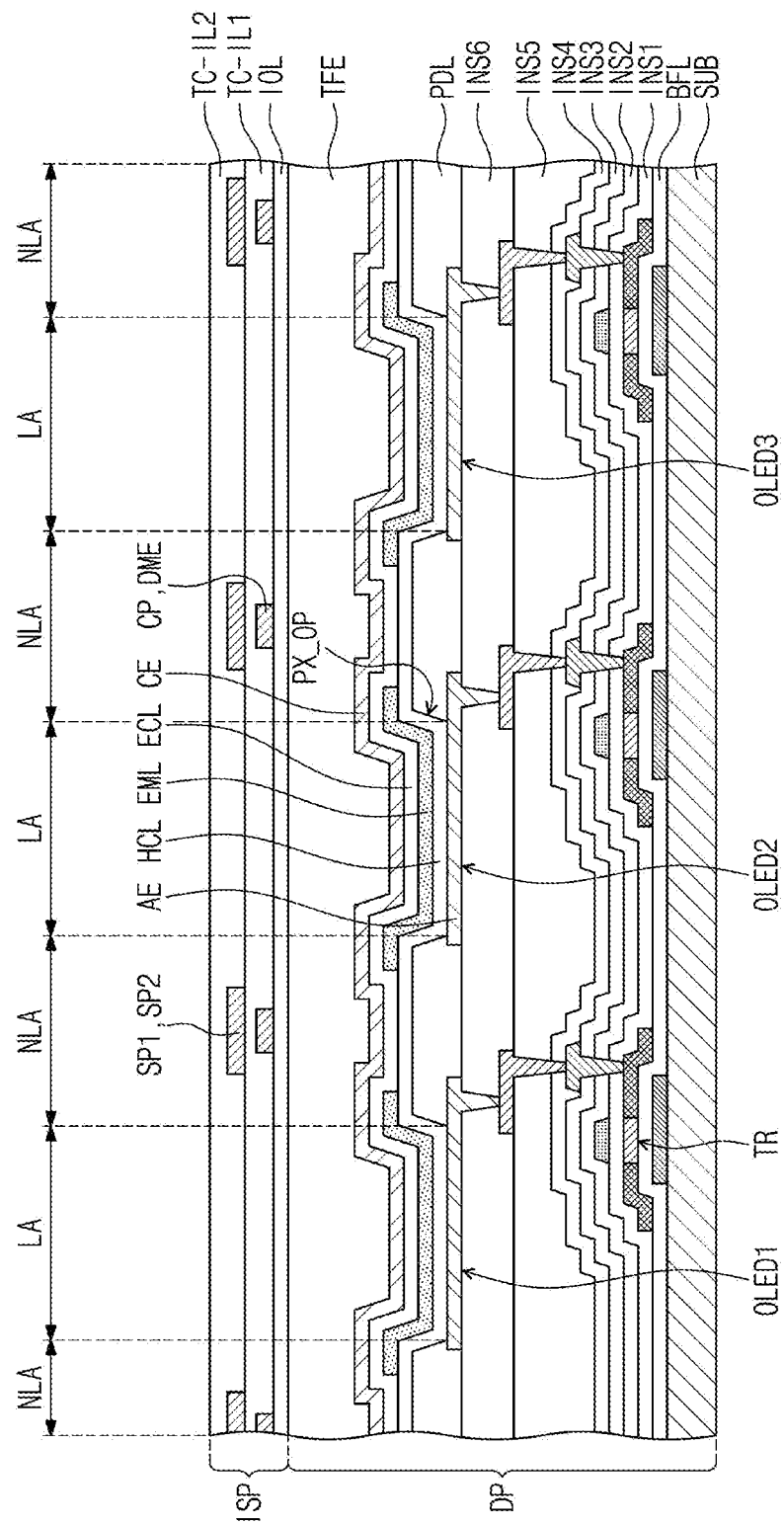
FIG. 19 is a diagram illustrating a cross-section of a display panel and an input sensing part in a portion in which a first light emitting device, a second light emitting device, and a third light emitting device adjacent to each other illustrated in FIG. 14A are disposed.

FIG. 19 is a diagram illustrating a cross-section of a display panel and an input sensing part in a portion in which a first light emitting device, a second light emitting device, and a third light emitting device adjacent to each other as illustrated in FIG. 14A are disposed.

Referring to FIG. 19, the input sensing part ISP may be disposed on the display panel DP. Configurations of the transistors TR and the light emitting devices OLED1, OLED2, and OLED3 of the display panel DP have been described in detail with reference to FIG. 6, and thus additional descriptions thereof, which may be redundant, will be omitted to avoid redundancy. Since the cross-sectional configuration of the input sensing part ISP has also been previously described in detail with reference to FIGS. 11 to 16A, additional descriptions thereof, which may be redundant, will be omitted to avoid redundancy.

When viewed in a plan view, the light emitting devices OLED1, OLED2, and OLED3 may be disposed to overlap the emission areas LA, respectively. The input sensing part ISP may be disposed on the thin film encapsulation layer TFE. For example, the input sensing part ISP may be directly disposed on the thin film encapsulation layer TFE. The connection patterns CP and the dummy electrodes DME may be disposed on the insulating layer IOL. When viewed in a plan view, the connection patterns CP and the dummy electrodes DME may be disposed to overlap the non-emission area NLA.

The first and second sensing parts SP1 and SP2 may be disposed on the first insulating layer TC-IL1. When viewed in a plan view, the first and second sensing parts SP1 and SP2 may be disposed to overlap the non-emission area NLA. As described above, the widths of the first and second sensing parts SP1 and SP2 may be greater than the widths of the connection patterns CP and the dummy electrodes DME.

Referring to FIGS. 18 and 19, as described above, the dummy electrodes DME may receive a ground voltage or a second voltage. When a driving signal is applied to the input sensing part ISP and a driving signal is applied to the display panel DP, noise may be generated due to signal interference between the input sensing part ISP and the display panel DP. Such noise may interfere with the operation of the input sensing part ISP and the display panel DP.

When the ground voltage or the second voltage is applied to the dummy electrodes DME that is disposed between the display panel DP and the first and second sensing parts SP1 and SP2, signal interference may decrease by the dummy electrodes DME. Accordingly, noise due to signal interference may be decreased.

Figure 20:
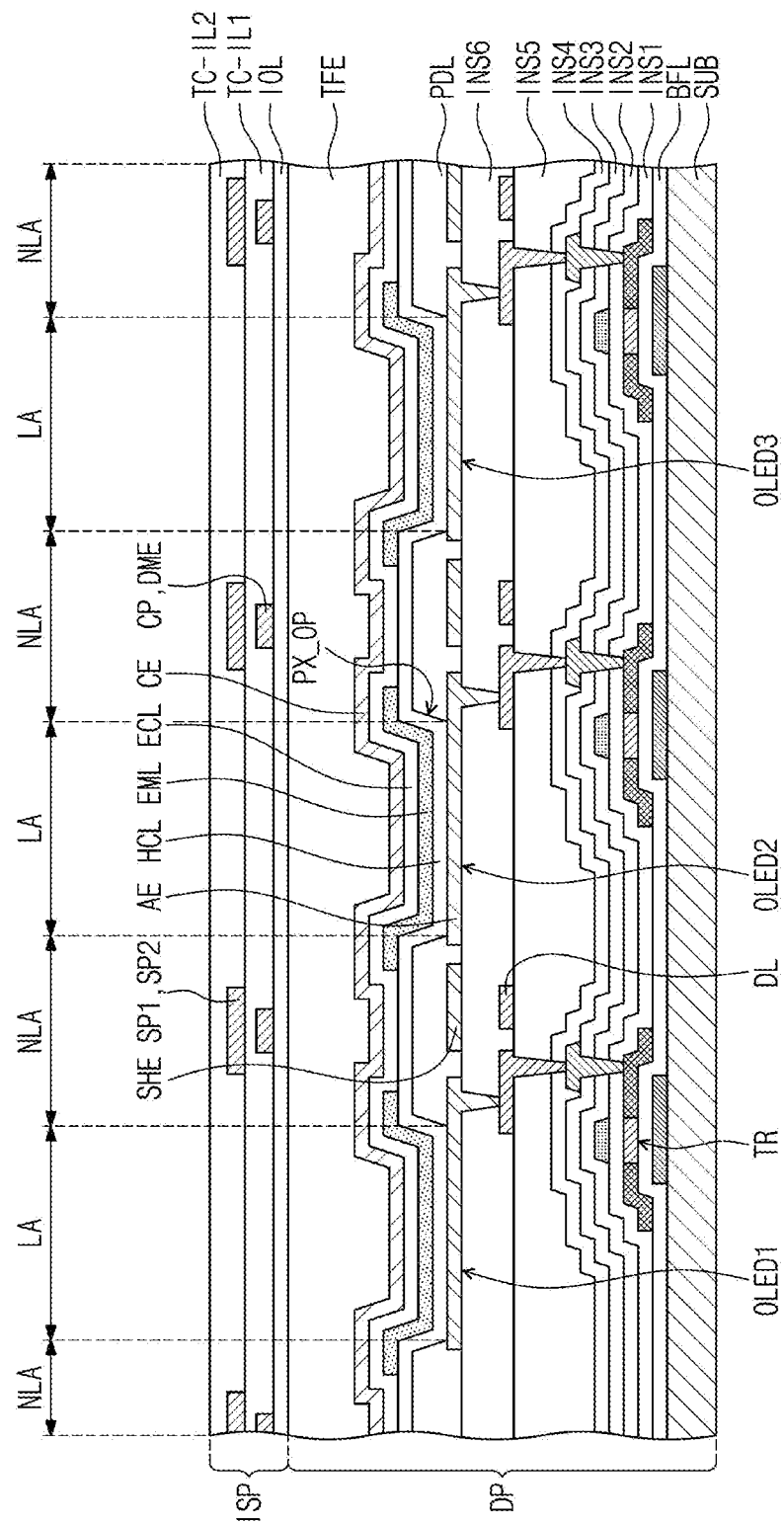
FIG. 20 is a diagram illustrating a cross-section of a display panel and an input sensing part, according to an embodiment of the present invention.

FIG. 20 is a diagram illustrating a cross-section of a display panel and an input sensing part, according to an embodiment of the present invention.

Illustratively, FIG. 20 is illustrated as a cross-section corresponding to FIG. 19, and hereinafter a configuration illustrated in FIG. 20 will be mainly described with a configuration different from the configuration illustrated in FIG. 19.

Referring to FIG. 20, the data lines DL may be disposed on the insulating layer INS5. The data lines DL may be some of the data lines DL1 to DLn illustrated in FIG. 5.

Shielding electrodes SHE may be disposed on the data lines DL. The shielding electrodes SHE may be disposed on the sixth insulating layer INS6. When viewed in a plan view, the shielding electrodes SHE may be disposed to overlap the data lines DL, respectively. Each of the shielding electrodes SHE may have a width greater than that of the data lines DL.

The shielding electrodes SHE may be disposed on the same layer as first electrodes AE. The shielding electrodes SHE may receive a ground voltage. However, the present invention is not limited thereto, and a second voltage having a level lower than that of the first voltage described above may be applied to the shielding electrodes SHE.

A signal applied to the data lines DL and a signal applied to the first and second sensing parts SP1 and SP2 may mutually affect each other. Noise may be generated by such signal interference.

When the ground voltage or the second voltage is applied to the shielding electrodes SHE disposed between the data lines DL and the first and second sensing parts SP1 and SP2, signal interference may be decreased by the shielding electrodes SHE. Accordingly, noise due to signal interference may be decreased.

Figure 21:
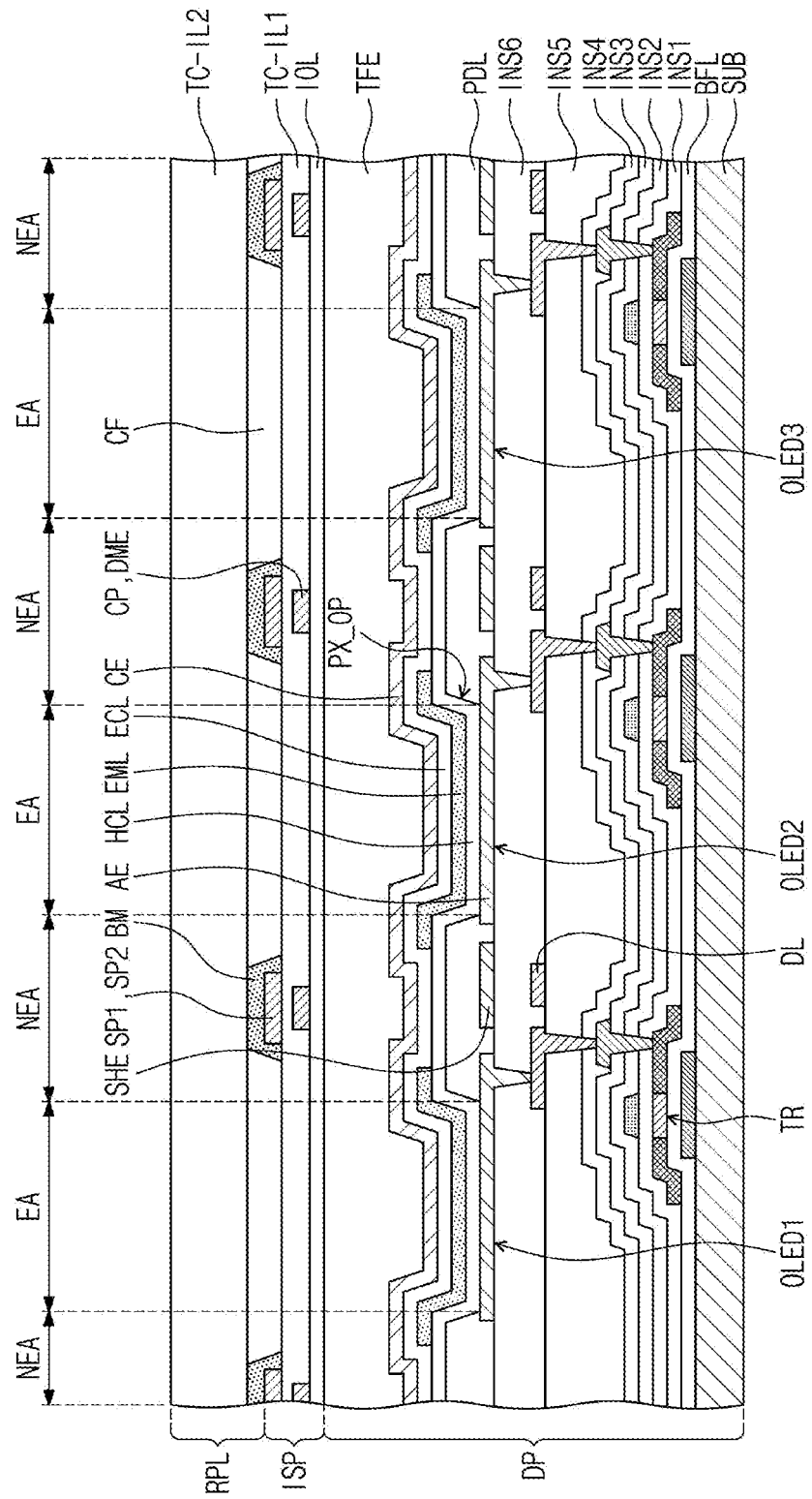
FIG. 21 is a diagram illustrating a cross-section of a display panel and an input sensing part, according to an embodiment of the present invention.

FIG. 21 is a diagram illustrating a cross-section of a display panel and an input sensing part, according to an embodiment of the present invention.

Illustratively, FIG. 21 is illustrated as a cross-section corresponding to FIG. 20, and hereinafter a configuration illustrated in FIG. 21 will be mainly described with a configuration different from the configuration illustrated in FIG. 20.

Referring to FIG. 21, the reflection prevention layer RPL may be disposed on the input sensing part ISP. The reflection prevention layer RPL may include a plurality of color filters CF and a black matrix BM that is disposed between the color filters CF. The color filters CF and the black matrix BM may be disposed on the first insulating layer TC-IL1. The second insulating layer TC-IL2 may be disposed on the color filters CF and the black matrix BM.

When viewed in a plan view, the color filters CF may overlap the emission areas LA, respectively. When viewed in a plan view, the black matrix BM may have a width less than that of the pixel defining layer PDL and may overlap the non-emission area NLA. The black matrix BM and the color filters CF may be disposed on the same layer.

The black matrix BM may be disposed on the first and second sensing parts SP1 and SP2 and may cover the first and second sensing parts SP1 and SP2. For example, the black matrix BM may cover the first and second branch portions BP1 and BP2 described above. The black matrix BM may be disposed on the first insulating layer TC-IL1 to cover the first and second sensing parts SP1 and SP2.

As illustrated in FIG. 2, the color filters CF may filter external light with the same color as that of the light emitting devices OLED1, OLED2, and OLED3. In this case, the external light might not be perceived by the user. The black matrix BM has a black color and may prevent color mixing between the light emitting devices OLED1, OLED2, and OLED3. The pixel defining layer PDL may have a black color to prevent color mixing between the light emitting devices OLED1, OLED2, and OLED3.

FIG. 21 is a diagram illustrating a structure in which the reflection prevention layer RPL described in FIG. 2 is disposed on the input sensing part ISP. The configuration illustrated in FIGS. 15, 16A, 19, and 20 described above is a structure using the above-described polarizing film, and the polarizing film may be attached to the second insulating layer TC-IL2 by an adhesive layer. For example, the polarizing film is omitted from FIGS. 15, 16A, 19, and 20.

Figure 22:
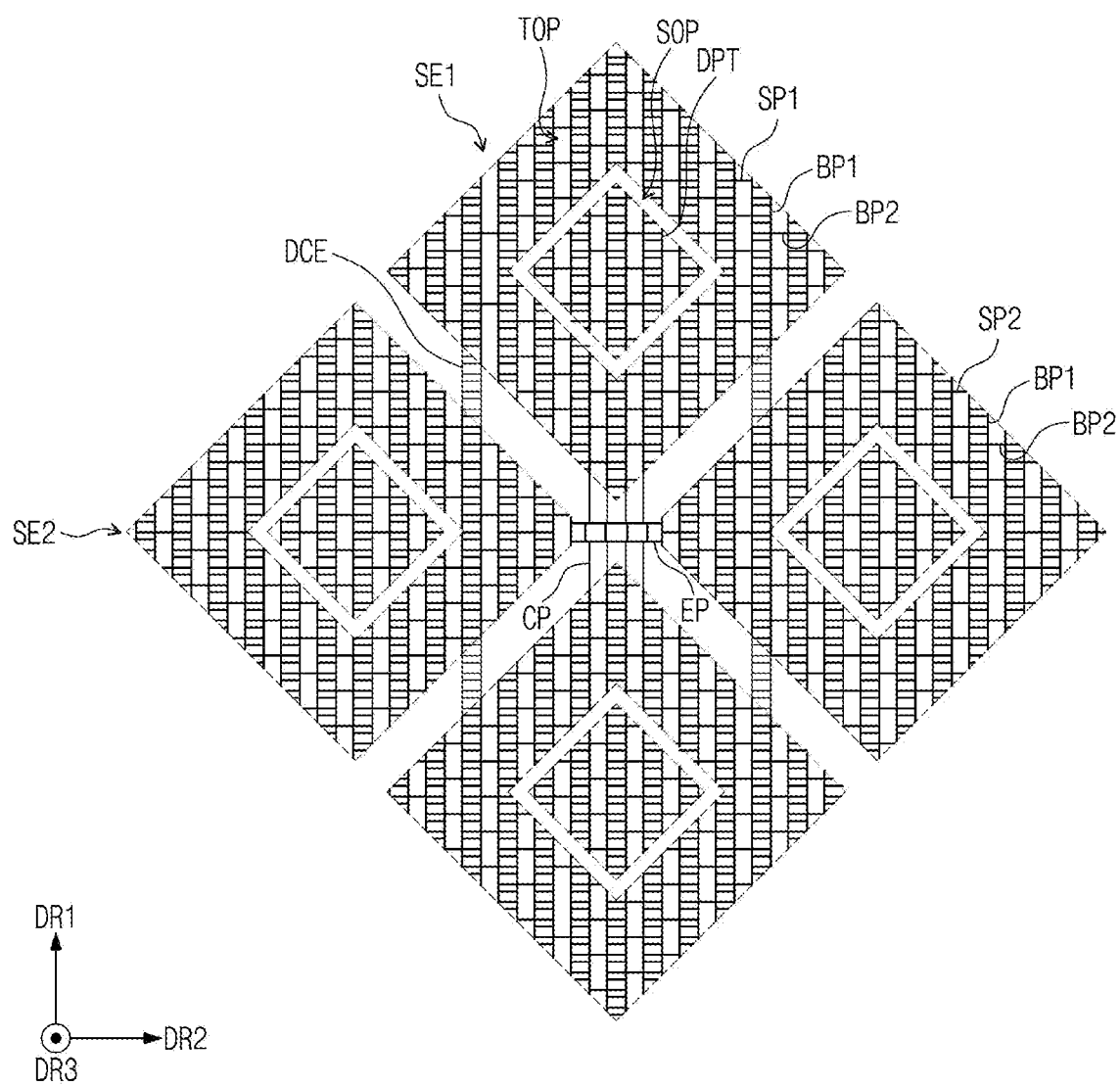
FIG. 22 is a diagram illustrating a configuration of first and second sensing parts of an input sensing part, according to an embodiment of the present invention.

FIG. 22 is a diagram illustrating a configuration of first and second sensing parts of an input sensing part, according to an embodiment of the present invention.

For example, FIG. 22 is illustrated as a plane corresponding to FIG. 12. Hereinafter, the configuration illustrated in FIG. 22 will be described with a focus on the configuration different from the configuration illustrated in FIG. 12.

Referring to FIG. 22, openings SOP may be defined in each of the first and second sensing parts SP1 and SP2. The openings SOP may be formed by removing some portions of each of the first and second sensing parts SP1 and SP2. Dummy patterns DPT may be respectively disposed in the openings SOP. For example, the edges of the dummy patterns DPT are illustrated with dotted lines.

The dummy patterns DPT may be disposed on the same layer as the first and second sensing parts SP1 and SP2. The dummy patterns DPT may be formed by being simultaneously patterned with the same material as the first and second sensing parts SP1 and SP2.

A ground voltage or a second voltage may be applied to the dummy patterns DPT. When the ground voltage or the second voltage is applied to the dummy patterns DPT, signal interference between the input sensing part ISP and the display panel DP may be further reduced.

Figure 23:
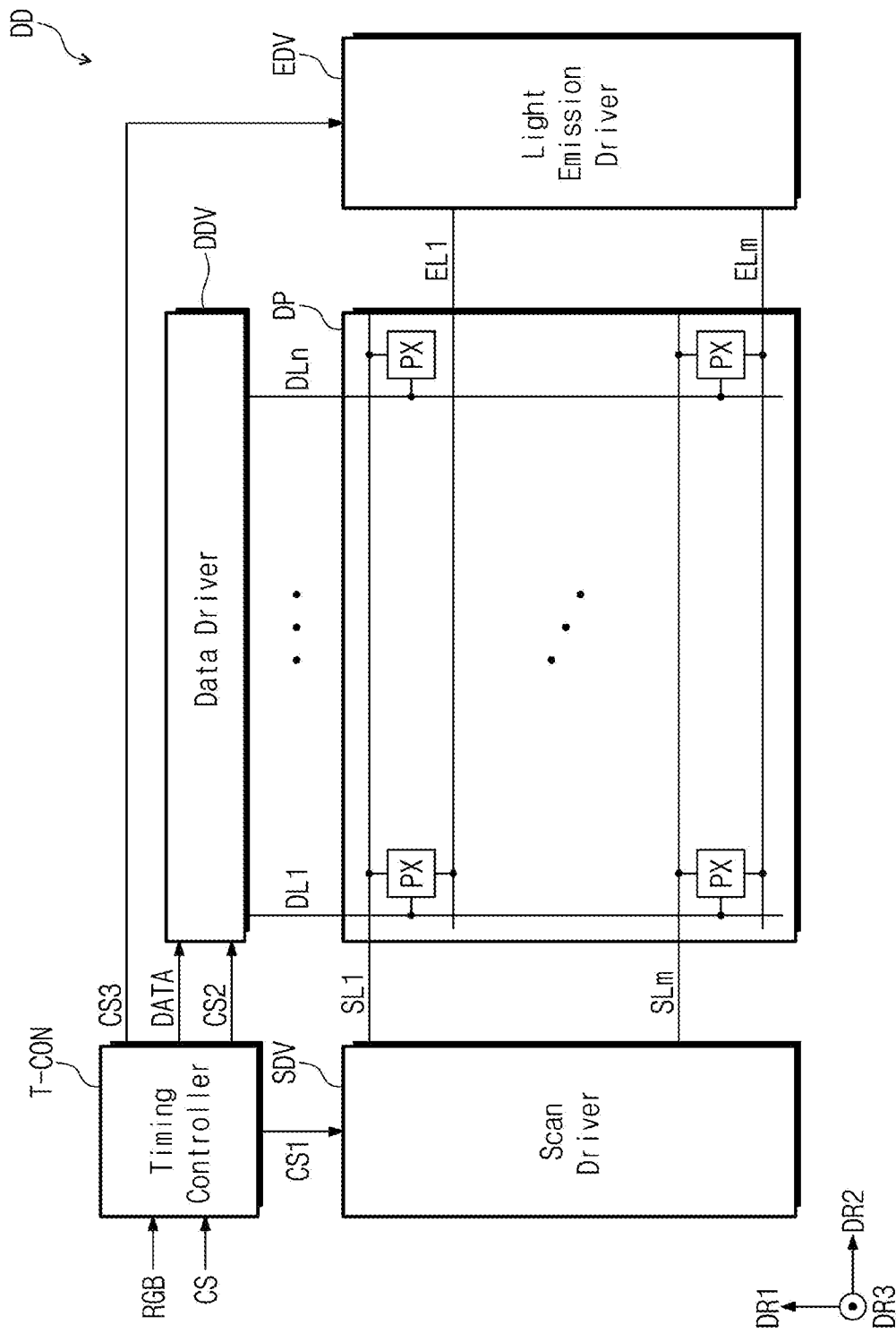
FIG. 23 is a block diagram of a display device, according to an embodiment of the present invention.

FIG. 23 is a block diagram of a display device, according to an embodiment of the present invention.

FIG. 23 is a block diagram illustrating a planar configuration illustrated in FIG. 5. Hereinafter, descriptions of operations overlapping those of FIG. 5 will be omitted to avoid redundancy.

Referring to FIG. 23, a timing controller T-CON may receive image signals RGB and a control signal CS. The timing controller T-CON may generate image data DATA by converting the data format of the image signals RGB to meet an interface specification with the data driver DDV. The image data DATA may be provided to the data driver DDV.

The timing controller T-CON may generate a first control signal CS1, a second control signal CS2, and a third control signal CS3 in response to the control signal CS. The first control signal CS1 may be provided to the scan driver SDV as a scan control signal. The second control signal CS2 may be provided to the data driver DDV as a data control signal. The third control signal CS3 may be provided to the light emission driver EDV as an emission control signal.

The scan driver SDV may generate scan signals in response to the first control signal CS1. The scan signals may be provided to the pixels PX through the scan lines SL1 to SLm. The data driver DDV may convert the image data DATA into data voltages in response to the second control signal CS2. The data voltages may be provided to the pixels PX through the data lines DL1 to DLn. The light emission driver EDV may generate the emission signals in response to the third control signal CS3. The emission signals may be applied to the pixels PX through the emission lines EL1 to ELm.

Figure 24:
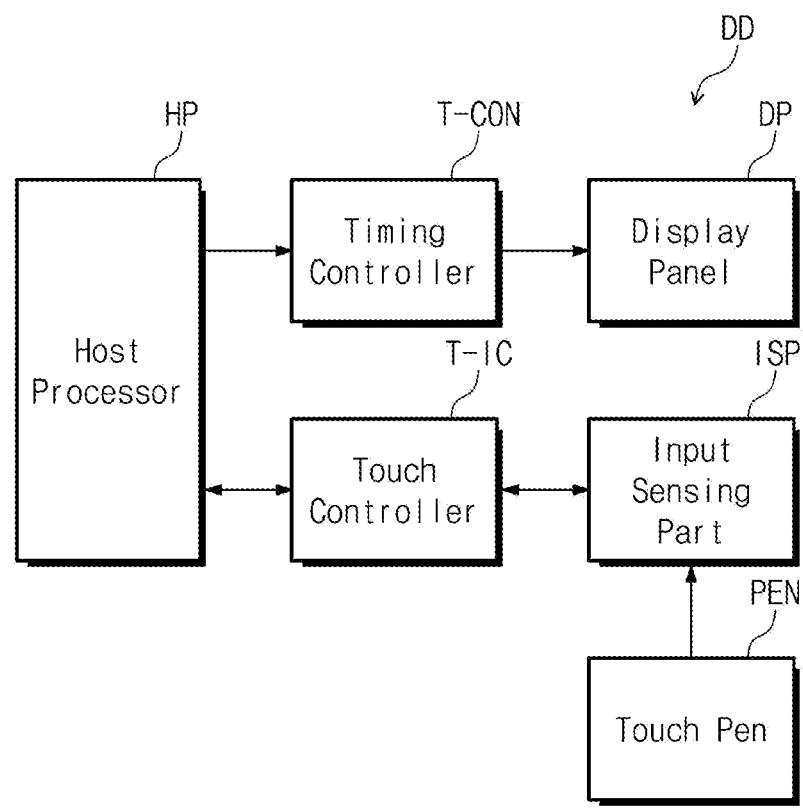
FIG. 24 is a block diagram illustrating control components for controlling a display panel and an input sensing part.

FIG. 24 is a block diagram illustrating control components for controlling a display panel and an input sensing part.

Referring to FIG. 24, the display device DD may include a host processor HP, the timing controller T-CON, a touch controller T-IC, the display panel DP, the input sensing part ISP, and the touch pen PEN.

The timing controller T-CON may control the operation of the display panel DP. For example, as described above, the timing controller T-CON may control the operations of the scan driver SDV, the data driver DDV, and the light emission driver EDV for driving the display panel DP. The display panel DP may be driven by the scan driver SDV, the data driver DDV, and the light emission driver EDV to display an image.

The touch controller T-IC may control the operation of the input sensing part ISP. For example, the touch controller T-IC may provide a driving signal to the input sensing part ISP and may sense a touch with respect to the input sensing part ISP. For example, the touch controller T-IC may sense a touch of the touch pen PEN when the touch pen PEN touches the input sensing part ISP.

The host processor HP may control the timing controller T-CON to display an image through the display panel DP. For example, the host processor HP provides the aforementioned control signal CS and image signals RGB to the timing controller T-CON, so that the display panel DP may display an image by controlling the timing controller T-CON.

The host processor HP may control the touch controller T-IC to receive a sensing signal associated with an external touch through the input sensing part ISP. For example, the host processor HP may provide a touch control signal to the touch controller T-IC. The touch controller T-IC may drive the input sensing part ISP in response to the touch control signal and may sense a touch on the input sensing part ISP. The touch sensing signal may be provided to the host processor HP through the touch controller T-IC.

The host processor HP may perform an operation corresponding to the touch sensing signal. For example, when a specific application is touched on a display screen by the user, a touch sensing signal may be provided to the host processor HP through the touch controller T-IC. The host processor HP may provide signals for executing a specific application to the timing controller T-CON. The display panel DP may display a screen corresponding to a specific application under the control of the timing controller T-CON.

Operating frequencies of the display panel DP and the touch pen PEN may be different from each other. For example, the operating frequency of the touch pen PEN may be greater than the operating frequency of the display panel DP. For example, the operating frequency of the display panel DP may be about 120 Hz, and the operating frequency of the touch pen PEN may be about 240 Hz.

Figure 25:
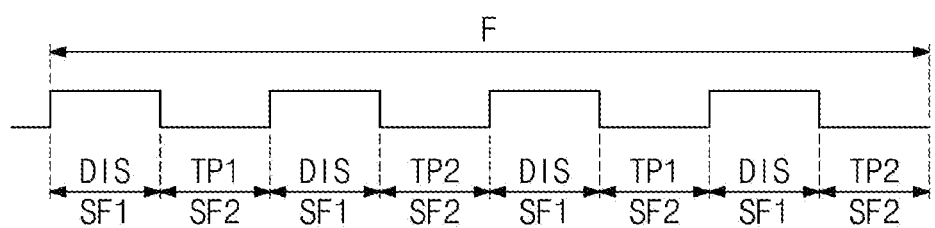
FIG. 25 is a diagram illustrating a driving timing of a display device, according to an embodiment of the present invention.

FIG. 25 is a diagram illustrating a driving timing of a display device, according to an embodiment of the present invention.

In FIG. 25, an operation timing of one frame 'F' of the display device DD is illustrated by way of example.

Referring to FIG. 25, the display device DD may be driven in units of frames 'F'. For example, one frame 'F' is illustrated, but the frame illustrated in FIG. 25 may be repeatedly performed. The display panel DP and the input sensing part ISP may be driven in units of frames.

The frame 'F' may include a plurality of display periods DIS and a plurality of touch periods TP1 and TP2. The display panel DP may display an image during the display periods DIS. The input sensing part ISP may sense an external input during the touch periods TP1 and TP2. The external input may be a user's touch or a touch of the touch pen PEN.

During the touch periods TP1 and TP2, the user's touch and the touch of the touch pen PEN may be alternately sensed. The touch periods TP1 and TP2 may include the plurality of first touch periods TP1 and the plurality of second touch periods TP2. A user's touch may be sensed during the first touch periods TP1. A touch of the touch pen PEN may be sensed during the second touch periods TP2.

When the operating frequencies of the display panel DP and the touch pen PEN are different from each other, and when the image display operation of the display panel DP and the operation of the touch pen PEN are performed at the same timing, a signal delay may occur due to mutual signal interference. In an embodiment of the present invention, an image display operation of the display panel DP and a sensing operation of the touch pen PEN may be performed in separate periods. In this case, signal delay may be reduced by decreasing mutual signal interference.

Figure 26:
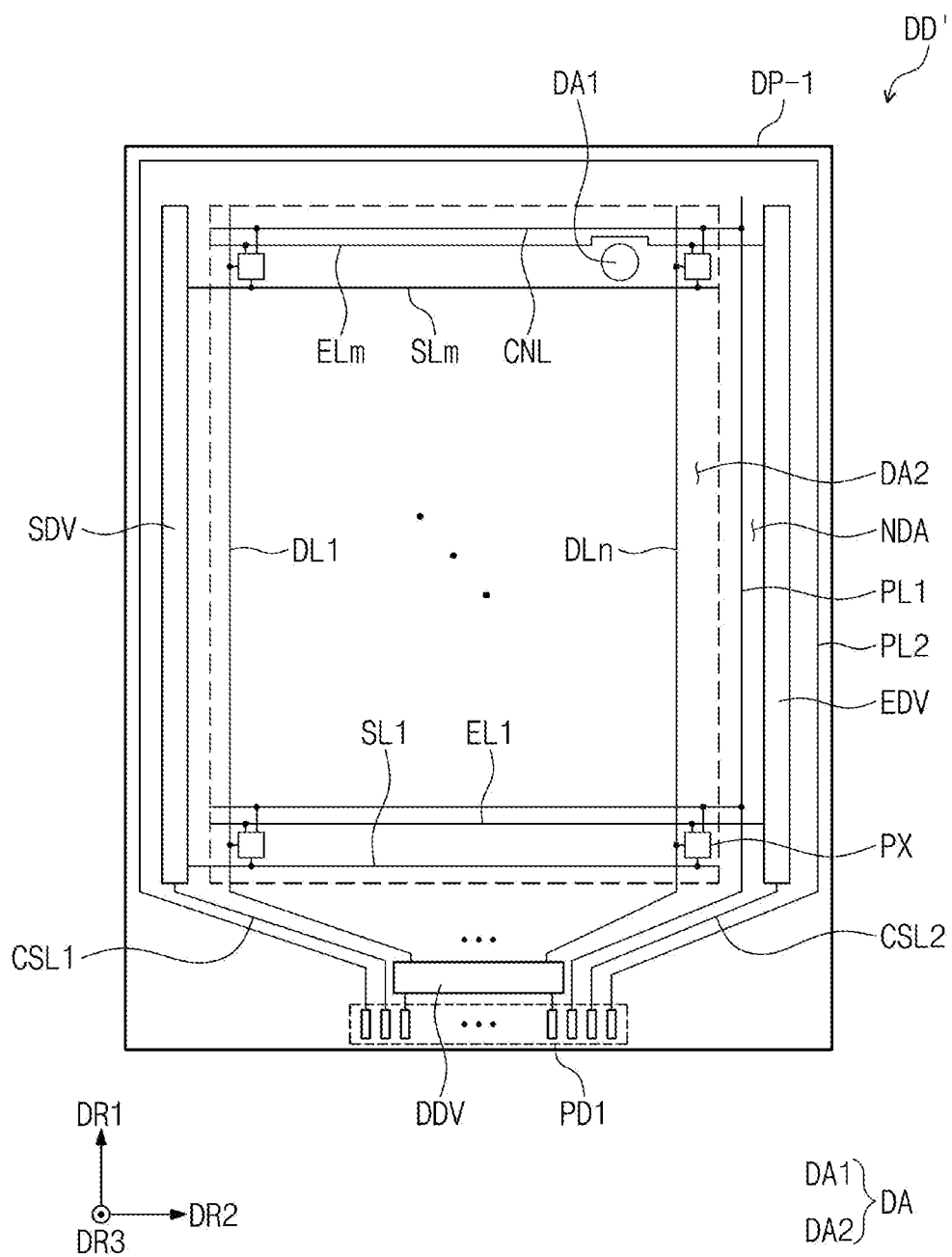
FIG. 26 is a diagram illustrating a configuration of a display panel, according to an embodiment of the present invention.
Figure 27:
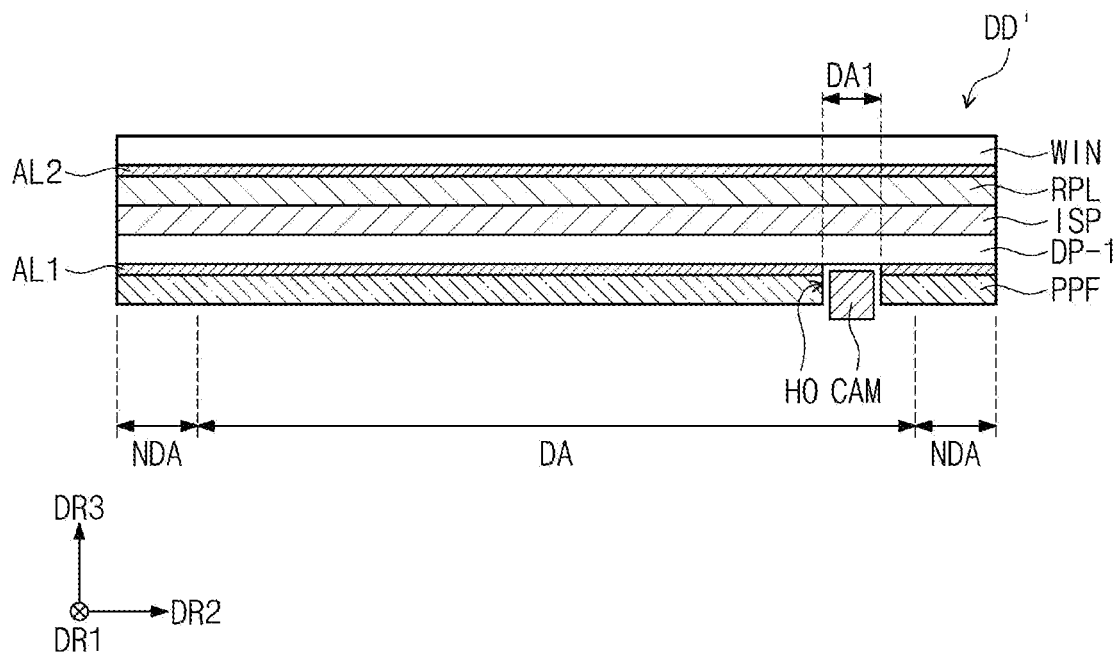
FIG. 27 is a diagram illustrating a cross-section of a display device including a display panel illustrated in FIG. 26.

FIG. 26 is a diagram illustrating a configuration of a display panel, according to an embodiment of the present invention. FIG. 27 is a diagram illustrating a cross-section of a display device including a display panel illustrated in FIG. 26.

FIG. 26 is illustrated as a plane corresponding to FIG. 5, and FIG. 27 is illustrated as a cross-section corresponding to FIG. 2. Hereinafter, a configuration different from the configuration illustrated in FIGS. 2 and 5 will be described with reference to FIGS. 26 and 27.

Referring to FIGS. 26 and 27, a display device DD' may include a display panel DP-1. The display area DA of the display panel DP-1 may include a first display area DA1 and a second display area DA2 at least partially surrounding the first display area DA1.

The first display area DA1 and the second display area DA2 may display an image. The first display area DA1 may have a higher light transmittance than that of the second display area DA2. A hole HO may be provided in the first display area DA1. The hole HO may be formed by removing portions of the panel protection film PPF and the first adhesive layer AL1 overlapping the first display area DA1.

A camera CAM may be disposed in the hall HO. Since the first display area DA1 has a higher light transmittance than that of the second display area DA2, the light passing through the first display area DA1 is provided to the camera CAM so that an external image may be captured.

Figure 28:
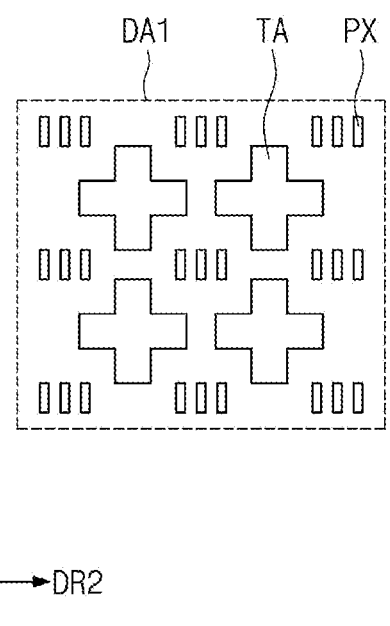
FIG. 28 is an enlarged view of a partial area of a first display area illustrated in FIGS. 26 and 27.

FIG. 28 is an enlarged view of a partial area of a first display area illustrated in FIGS. 26 and 27.

Referring to FIG. 28, the first display area DA1 may include a plurality of transmissive areas TA and a plurality of pixels PX. The transmissive areas TA may have a cross shape by way of example, but the shape of the transmissive areas TA is not limited thereto.

The transmissive areas TA may be arranged in the first direction DR1 and the second direction DR2. The pixels PX may be disposed around each of the transmissive areas TA. The configuration of the pixels PX may be the same as that of the pixels PX disposed in the second display area DA2.

The above-described light emitting device OLED and the transistor TR might not be disposed in each of the transmissive areas TA. Accordingly, the transmissive areas TA may have higher light transmittance than that of surrounding areas.

In the first display area DA1, the pixels PX may display an image. In addition, light may be provided to the camera CAM through the transmissive areas TA in the first display area DA1. Accordingly, in the first display area DA1, an image may be displayed and an external image may be captured through the camera CAM.

Figure 29:
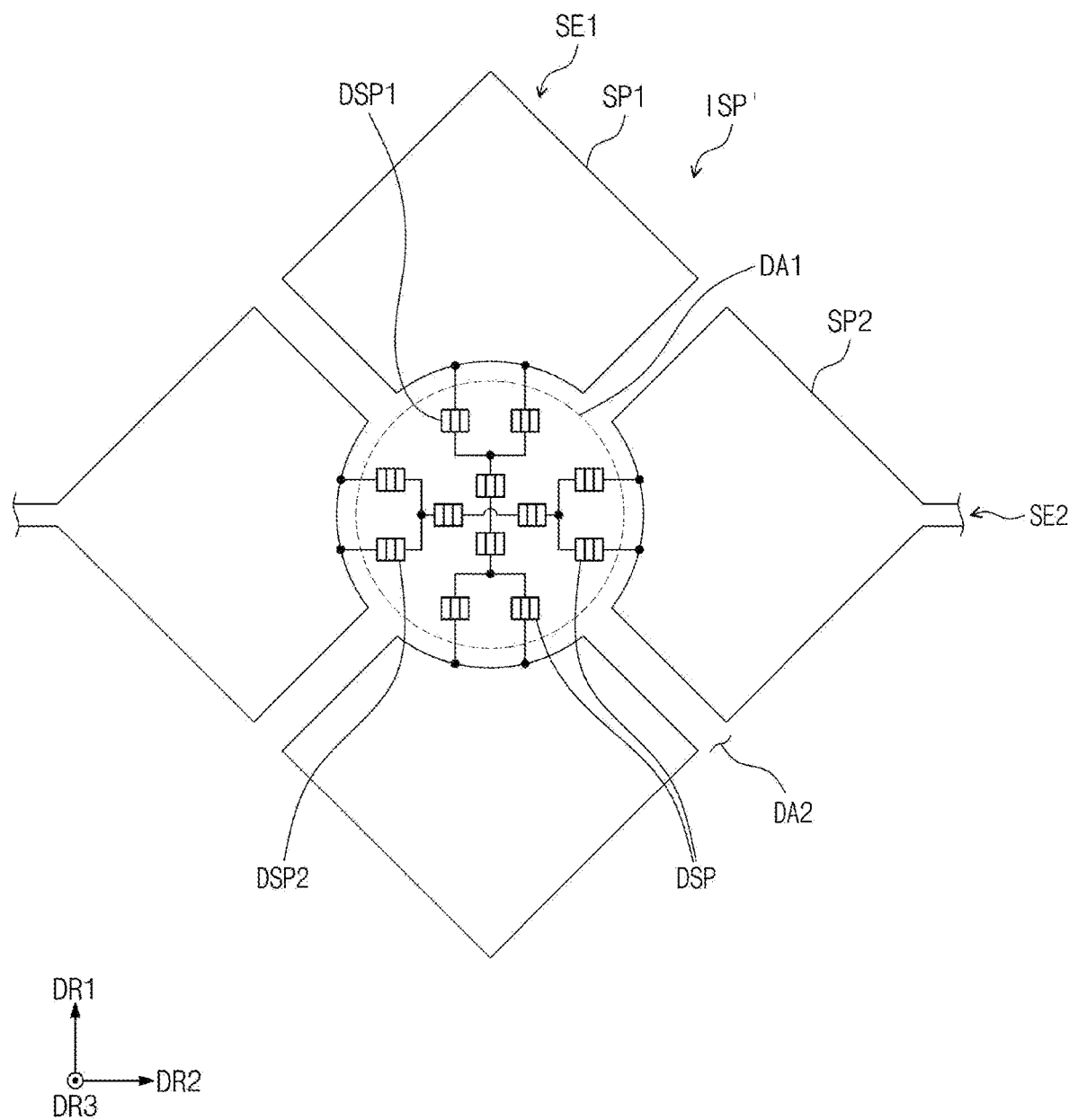
FIG. 29 is a diagram illustrating dummy sensing parts disposed on a first display area illustrated in FIG. 27.

FIG. 29 is a diagram illustrating dummy sensing parts disposed on a first display area illustrated in FIG. 27.

For example, two first sensing parts SP1 adjacent to each other and two second sensing parts SP2 adjacent to each other are illustrated in FIG. 29, and for convenience of description, the first and second sensing parts SP1 and SP2 are illustrated in a rhombus shape. However, the first and second sensing parts SP1 and SP2 may have the mesh shape illustrated in FIG. 12 or FIG. 17.

Referring to FIGS. 28 and 29, the first and second sensing parts SP1 and SP2 might not be disposed in the first display area DA1. An input sensing part ISP' may further include the plurality of dummy sensing parts DSP disposed on the first display area DA1 of the display panel DP-1. The dummy sensing parts DSP are formed to extend along between the pixels PX, and thus may include lines extending in the first and second directions DR1 and DR2.

The arrangement density of the dummy sensing parts DSP in the first display area DA1 may be less than the arrangement density of the first and second sensing parts SP1 and SP2 in the second display area DA2. The dummy sensing parts DSP may include a plurality of first dummy sensing parts DSP1 and a plurality of second dummy sensing parts DSP2. The plurality of first dummy sensing parts DSP1 may be connected to the first sensing parts SP1, and the plurality of second dummy sensing parts DSP2 may be connected to the second sensing parts SP2. An external input may be sensed in the first display area DA1 by the dummy sensing parts DSP.

Table 2 below illustrates a capacitance Cm of a capacitor formed by the first and second sensing parts SP1 and SP2, the capacitance Cm of a capacitor formed by the dummy sensing parts DSP depending on various line widths of the dummy sensing parts DSP, and a sensing capacitance dCm.

The capacitances Cm and the sensing capacitance dCm of the capacitor may be in units of picofarads (pF). The sensing capacitance dCm may be defined as a capacitance changed according to the touch in the capacitor capacitances Cm when a touch is performed on the input sensing part ISP. As the sensing capacitance dCm increases, the touch sensitivity may be relatively high.

TABLE 2

|  | Cm | dCm |
|---|---|---|
| SP1, SP2 (4 μm) | 490 pF | 74 pF |
| DSP (4 μm) | 290 pF | 39 pF |
| DSP (5 μm) | 318 pF | 42 pF |
| DSP (6 μm) | 337 pF | 43 pF |
| DSP (7 μm) | 360 pF | 45 pF |
| DSP (8 μm) | 377 pF | 46 pF |
| DSP (10 μm) | 411 pF | 49 pF |

Referring to Table 2, the capacitance Cm of the capacitors formed by the first and second sensing parts SP1 and SP2 may be greater than the capacitance Cm of the capacitors formed by the dummy sensing parts DSP. Since the first and second sensing parts SP1 and SP2 have the sensing capacitance dCm greater than that of the dummy sensing parts DSP, the touch sensitivity of the first and second sensing parts SP1 and SP2 may be higher than that of the dummy sensing parts DSP. As the line width of the dummy sensing parts DSP increases, the sensing capacitance dCm increases. Therefore, as the line width of the dummy sensing parts DSP increases, the touch sensitivity may be higher.

According to an embodiment of the present invention, since connection patterns and dummy electrodes disposed under the first and second sensing parts each have a width less than a width of each of the first and second sensing parts, it might not be perceived from the outside by being covered by the first and second sensing parts.

In addition, according to an embodiment of the present invention, one frame is divided into a plurality of display periods and a plurality of touch periods, and an image is displayed in the display periods. In addition, according to an embodiment of the present invention, a touch operation associated with a touch pen is performed in the touch periods. Accordingly, since the image display operation and the operation of the touch pen are performed in separate periods, signal interference between the display panel and the touch pen may be prevented.

While the present invention has been described with reference to embodiments thereof, it will be understood by those of ordinary skill in the art that various changes in form and details may be made thereto without departing from the spirit and scope of the present invention.

What is claimed is:

1. A display device comprising:
   a display panel including a plurality of first light emitting devices having a first color, a plurality of second light emitting devices having a second color, a plurality of third light emitting devices having a third color, and a pixel defining layer separating the first, second, and third light emitting devices from each other, and
   an input sensing part disposed on the display panel and overlapping the pixel defining layer, wherein the input sensing part includes at least one sensing part,
   wherein a first direction and a second direction that intersect each other are defined,
   wherein a width of each of the plurality of third light-emitting elements with respect to the second direction is smaller than a width of each of the plurality of first and second light-emitting elements with respect to the second direction, and
   wherein a first distance with respect to the second direction between a first light-emitting element and a third light-emitting element adjacent to each other in the second direction among the plurality of first and third light-emitting elements is larger than a second distance with respect to the first direction between a first light-emitting element and a second light-emitting element adjacent to each other in the first direction among the plurality of first and second light-emitting elements, and
   wherein a width of the sensing part disposed between the first light-emitting element and the third light-emitting element adjacent to each other in the second direction is greater than a width of the sensing part disposed between the first light-emitting element and the second light-emitting element adjacent to each other in the first direction.

2. The display device of claim 1, wherein the first color is red, the second color is green, and the third color is blue.

3. The display device of claim 1, wherein the input sensing part further includes a connection pattern disposed under the sensing part, and
   wherein a width of the connection pattern is less than the width of the sensing part.

4. The display device of claim 3, wherein the first and second light emitting devices are arranged in odd-numbered columns, wherein the third light emitting devices are arranged in even-numbered columns, wherein the column extends in the first direction, and wherein the third light emitting devices are arranged adjacent to each other in pairs in each of the even-numbered columns and are grouped into pairs to form a plurality of groups each of which includes a pair of third light emitting devices, and wherein the first light emitting devices and the second light emitting devices are alternately arranged in the first direction, wherein a pair of first and second light emitting devices that are adjacent to each other among the first and second light emitting devices are adjacent to a corresponding third light emitting device among the third light emitting devices in a second direction crossing the first direction, and wherein the plurality of groups are staggered, with respect to each other, in two adjacent even-numbered columns.

5. The display device of claim 4, wherein the sensing part includes:

first sensing parts arranged in the first direction and connected to each other through the connection pattern;

second sensing parts arranged in the second direction crossing the first direction; and an extension pattern extending from the second sensing parts.

6. The display device of claim 5, wherein the connection pattern is connected to first sensing parts between a k-th group and a (k+1)-th group among the plurality of groups disposed under the first sensing parts, and where 'k' is a natural number.

7. The display device of claim 6, wherein a first distance in the second direction between the pair of the first and second light emitting devices and the corresponding third light emitting devices is greater than a second distance in the first direction between the pair of the first and second light emitting devices, and wherein a third distance in the first direction between a third light emitting device of the k-th group and a third light emitting device of the (k+1)-th group facing each other in the first direction is greater than each of the first distance and the second distance.

8. The display device of claim 5, wherein each of the first sensing parts includes a plurality of branch portions disposed between the first, second, and third light emitting devices and extending in the first direction and the second direction, without overlapping the first, second, and third light emitting devices, wherein each of the first sensing parts has a mesh shape, and wherein among the plurality of branch portions, the branch portions extending in the second direction do not extend between the third light emitting devices of each of the plurality of groups.

9. The display device of claim 8, wherein a first width in the second direction of a branch portion, of the plurality of branch portions, disposed between the pair of first and second light emitting devices and the corresponding third light emitting device is greater than a second width in the first direction of a branch portion, of the plurality of branch portions, disposed between the pair of first and second light emitting devices, and wherein a third width in the first direction of a branch portion, of the plurality of branch portions, disposed between a third light emitting device of a k-th group and a third light emitting device of a (k+1)-th group facing each other in the first direction is greater than the first width, and where 'k' is a natural number.

10. The display device of claim 8, wherein the connection pattern disposed under the first sensing parts overlaps the branch portions and has a width less than that of each of the plurality of branch portions.

11. The display device of claim 8, wherein the connection pattern includes:

a connection portion extending in the second direction between a k-th group and a (k+1)-th group; and extension portions extending from the connection portion and extending in the first direction between first and second light emitting devices, which are adjacent to the k-th and (k+1)-th groups, and the k-th and (k+1)-th groups, and wherein the connection portion is connected to the branch portion disposed between the k-th group and the (k+1)-th group, and where 'k' is a natural number.

12. The display device of claim 7, further comprising:

dummy electrodes disposed on a same layer as the connection pattern, and spaced apart from the connection pattern, wherein the dummy electrodes overlap each of the first sensing parts, and wherein the dummy electrodes have a width less than that of each of the first sensing parts, and are connected to each other, wherein the dummy electrodes receive a ground voltage.

13. The display device of claim 7, further comprising:

a black matrix disposed on each of the first sensing parts and overlapping the pixel defining layer.

14. The display device of claim 7, further comprising:

a plurality of dummy patterns disposed in openings defined in the first sensing parts and spaced apart from the first sensing parts, and wherein the dummy patterns receive a ground voltage.

15. The display device of claim 1, further comprising:

a data line; and a shielding layer disposed on the data line, and having a width greater than that of the data line, wherein the shielding layer overlaps the data line, and wherein each of the first, second, and third light emitting devices includes:

a first electrode;

a second electrode disposed on the first electrode; and an emission layer disposed between the first electrode and the second electrode, and wherein the shielding layer is disposed on a same layer as the first electrode and receives a ground voltage.

16. The display device of claim 1, wherein the display panel and the input sensing part are driven in units of frames, wherein the frame includes a plurality of display periods and a plurality of touch periods, wherein the display panel displays an image during the display periods, and the input sensing part senses an external input during the touch periods, and wherein, during the touch periods, a user's touch and a touch operation of a touch pen are alternately performed, and a driving frequency of the display panel and a driving frequency of the touch pen are different from each other.

17. The display device of claim 1, wherein the display panel includes:

a first display area; and a second display area at least partially surrounding the first display area, and wherein the first display area has a light transmittance greater than that of the second display area, and wherein the input sensing part further includes a dummy sensing part disposed on the first display area and connected to the sensing part.

18. A display device comprising:
a display panel including a plurality of first and second light emitting devices arranged in odd-numbered columns and a plurality of third light emitting devices arranged in even-numbered columns; and
an input sensing part disposed on the display panel, and
wherein the third light emitting devices are arranged adjacent to each other in pairs in each of the even-numbered columns, and are grouped into pairs to form a plurality of groups each of which includes the pair of third light emitting devices,
wherein the input sensing part includes:
first sensing parts arranged in a first direction;
a connection pattern connected to the first sensing parts;
second sensing parts arranged in the second direction crossing the first direction; and
an extension pattern extending from the second sensing parts,
wherein the connection pattern is connected to first sensing parts between a k-th group and a (k+1)-th group among the plurality of groups, when viewed on a plane, and where 'k' is a natural number,
wherein the connection pattern is disposed under the first and second sensing parts,
wherein the column extends in the first direction,
wherein a width of each of the plurality of third light-emitting elements with respect to the second direction is smaller than a width of each of the plurality of first and second light-emitting elements with respect to the second direction, and
wherein a first distance with respect to the second direction between a first light-emitting element and a third light-emitting element adjacent to each other in the second direction among the plurality of first and third light-emitting elements is larger than a second distance with respect to the first direction between a first light-emitting element and a second light-emitting element adjacent to each other in the first direction among the plurality of first and second light-emitting elements.

19. The display device of claim 18, wherein a width of the connection pattern is less than a width of the first and second sensing parts.

20. The display device of claim 18, wherein each of the first sensing parts includes a plurality of branch portions disposed between the first, second, and third light emitting devices and extending in the first direction and the second direction, without overlapping the first, second, and third light emitting devices,
wherein a first width in the second direction of a branch portion, of the plurality of branch portions, disposed between the pair of first and second light emitting devices and a corresponding third light emitting device is greater than a second width in the first direction of a branch portion, of the plurality of branch portions, disposed between the pair of first and second light emitting devices, and
wherein a third width in the first direction of a branch portion, of the plurality of branch portions, disposed between a third light emitting device of the k-th group and a third light emitting device of the (k+1)-th group facing each other in the first direction is greater than the first width.

21. An electronic device for provide an image, comprising:
a display device comprising:
a display panel including a plurality of first light emitting devices having a first color, a plurality of second light emitting devices having a second color, a plurality of third light emitting devices having a third color, and a pixel defining layer separating the first, second, and third light emitting devices from each other, and
an input sensing part disposed on the display panel and overlapping the pixel defining layer, wherein the input sensing part includes at least one sensing part,
wherein a first direction and a second direction that intersect each other are defined,
wherein a width of each of the plurality of third light-emitting elements with respect to the second direction is smaller than a width of each of the plurality of first and second light-emitting elements with respect to the second direction, and
wherein a first distance with respect to the second direction between a first light-emitting element and a third light-emitting element adjacent to each other in the second direction among the plurality of first and third light-emitting elements is larger than a second distance with respect to the first direction between a first light-emitting element and a second light-emitting element adjacent to each other in the first direction among the plurality of first and second light-emitting elements, and
wherein a width of the sensing part disposed between the first light-emitting element and the third light-emitting element adjacent to each other in the second direction is greater than a width of the sensing part disposed between the first light-emitting element and the second light-emitting element adjacent to each other in the first direction.

* * * * *